(12) United States Patent
Chung

(10) Patent No.: US 11,514,976 B2
(45) Date of Patent: Nov. 29, 2022

(54) MEMORY DEVICE HAVING PLANES

(71) Applicant: SK hynix Inc., Gyeonggi-do (KR)

(72) Inventor: Seung Hyun Chung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/349,421

(22) Filed: Jun. 16, 2021

(65) Prior Publication Data

US 2022/0180916 A1 Jun. 9, 2022

(30) Foreign Application Priority Data

Dec. 8, 2020 (KR) .................. 10-2020-0170766

(51) Int. Cl.
*G11C 7/00* (2006.01)
*G11C 11/4093* (2006.01)
*H03K 19/173* (2006.01)
*G11C 11/408* (2006.01)
*G11C 11/4096* (2006.01)

(52) U.S. Cl.
CPC ...... *G11C 11/4093* (2013.01); *G11C 11/4087* (2013.01); *G11C 11/4096* (2013.01); *H03K 19/1737* (2013.01)

(58) Field of Classification Search
CPC ................................. H03K 19/1737

USPC ...................................... 365/189.02
See application file for complete search history.

(56) References Cited

U.S. PATENT DOCUMENTS

| 2011/0110164 A1* | 5/2011 | Jeong ...................... G11C 29/02 365/185.23 |
| 2020/0265912 A1* | 8/2020 | Wieduwilt ............. G11C 29/52 |

FOREIGN PATENT DOCUMENTS

| KR | 10-2007-0090376 A | 9/2007 |
| KR | 10-2019-0089365 A | 7/2019 |

\* cited by examiner

*Primary Examiner* — Hoai V Ho
(74) *Attorney, Agent, or Firm* — IP & T Group LLP

(57) ABSTRACT

The present technology includes a memory device which includes a plurality of planes in which data is stored, a peripheral circuit configured to perform operations on the plurality of planes, micro-control circuits configured to control the peripheral circuit so that the operations on the plurality of planes are independently performed, and a memory manager including a control memory in which different control codes for controlling the peripheral circuit are stored, and configured to output the control codes to the micro-control circuits, wherein the memory manager is configured to sequentially output a selected control code among the control codes to the micro-control circuits respectively corresponding to the planes.

20 Claims, 19 Drawing Sheets

| | t1 | t2 | t3 | t4 | t5 | t6 | t7 | t8 | t9 | t10 | t11 | t12 |
|---|---|---|---|---|---|---|---|---|---|---|---|---|
| PL1 (M1) | SLG1 | SLG2 | SLG3 | SLG4 | SLG1 | SLG2 | SLG3 | SLG4 | SLG1 | SLG2 | SLG3 | ... |
| | CCD1 | CCD2 | CCD3 | CCD4 | CCD5 | CCD6 | CCD7 | CCD8 | CCD9 | CCD10 | CCD11 | ... |
| PL2 (M2) | | SLG1 | SLG2 | SLG3 | SLG4 | SLG1 | SLG2 | SLG3 | SLG4 | SLG1 | SLG2 | ... |
| | | CCD1 | CCD2 | CCD3 | CCD4 | CCD5 | CCD6 | CCD7 | CCD8 | CCD9 | CCD10 | ... |
| PL3 (M3) | | | SLG1 | SLG2 | SLG3 | SLG4 | SLG1 | SLG2 | SLG3 | SLG4 | SLG1 | ... |
| | | | CCD1 | CCD2 | CCD3 | CCD4 | CCD5 | CCD6 | CCD7 | CCD8 | CCD9 | ... |
| PL4 (M4) | | | | SLG1 | SLG2 | SLG3 | SLG4 | SLG1 | SLG2 | SLG3 | SLG4 | ... |
| | | | | CCD1 | CCD2 | CCD3 | CCD4 | CCD5 | CCD6 | CCD7 | CCD8 | ... | time →

MEMORY DEVICE HAVING PLANES

CROSS-REFERENCE TO RELATED APPLICATION

The present application claims priority under 35 U.S.C. § 119(a) to Korean patent application number 10-2020-0170766 filed on Dec. 8, 2020, which is incorporated herein by reference in its entirety.

BACKGROUND

1. Field of Invention

The present disclosure relates to a memory device, and more particularly, to a memory device including a control memory.

2. Description of Related Art

A memory device may include a volatile memory device in which stored data is destroyed when power supply is cut off, and a nonvolatile memory device in which stored data is maintained even though the power supply is cut off.

The volatile memory device may include a dynamic random-access memory (DRAM) and a static random-access memory (SRAM). The nonvolatile memory device may include a read only memory (ROM), a programmable read only memory (PROM), an erasable PROM (EPROM), an electrically EPROM (EEPROM), a NAND flash, and the like.

The memory device may include a memory cell array, a peripheral circuit, and a control circuit.

The memory cell array may include a plurality of memory cells, and the plurality of memory cells may store data. A method of storing one bit of data in one memory cell is referred to as a single level cell (SLC) method, and a method of storing two or more bits of data in one memory cell is referred to as a multi-level cell (MLC) method. A program operation of the MLC method may be classified into a triple level cell (TLC) method or a quadruple level cell (QLC) method according to the number of bits stored in the memory cell. In the TLC method, three bits of data may be stored in one memory cell, and in the QLC method, four bits of data may be stored in one memory cell.

The peripheral circuit may include a plurality of circuits capable of performing a program, read, or erase operation.

The control circuit may include a control memory for storing control codes for controlling the peripheral circuit, and may be configured to control the peripheral circuit using the control code selected according to a command.

SUMMARY

An embodiment of the present disclosure provides a memory device capable of reducing a size of a control memory in which control codes are stored.

A memory device according to an embodiment of the present disclosure includes a plurality of planes in which data is stored, a peripheral circuit configured to perform operations on the plurality of planes micro-control circuits configured to control the peripheral circuit so that the operations on the plurality of planes are independently performed, and a memory manager including a control memory in which different control codes for controlling the peripheral circuit are stored, and configured to output the control codes to the micro-control circuits, wherein the memory manager is configured to sequentially output a selected control code among the control codes to the micro-control circuits respectively corresponding to the planes.

A memory device according to an embodiment of the present disclosure includes a control memory including first to N-th memory groups in which different control codes are stored, first to N-th sub latch groups respectively connected to the first to N-th memory groups and configured to sequentially store the control codes stored in the first to N-th memory groups, respectively, and first to N-th plane MUXes configured to commonly receive the control codes from the first to N-th sub latch groups and output the received control codes to a selected micro-control circuit among first to N-th micro-control circuits.

A memory device according to an embodiment of the present disclosure includes a memory cell array divided into N number of groups configured to store different control codes, the groups outputting, one by one, the respective control codes sequentially at each interval, N number of latching circuit s each configured to latch the control codes output from a corresponding one among the groups, N number of multiplexer s sequentially activated at the interval, and each configured to provide, at the interval, the control code latched at the interval in the latching circuits, thereby sequentially providing, over the intervals, the control codes sequentially output from the memory cell array, and N number of control circuit s each configured to control a corresponding one of N number of storage circuit s to perform a plane interleaving operation by providing, at the interval, the corresponding storage circuit with the control code, which is provided from a corresponding one among the multiplexers.

A memory device according to an embodiment of the present disclosure includes N number of control circuits configured to control N number of storage circuits to perform a plane interleaving operation by providing, at each interval, the storage circuits with control codes, respectively, a memory cell array configured to output, at the interval, one among different control codes stored therein, and a managing circuit configured to provide, at the interval, one among the control circuits with the control code output from the memory cell array, thereby sequentially providing, over the intervals, the control circuits with each of the control codes sequentially output from the memory cell array.

The present technology may perform interleaving on a plurality of planes, and may reduce a size of a memory device.

DETAILED DESCRIPTION

Figure 1:
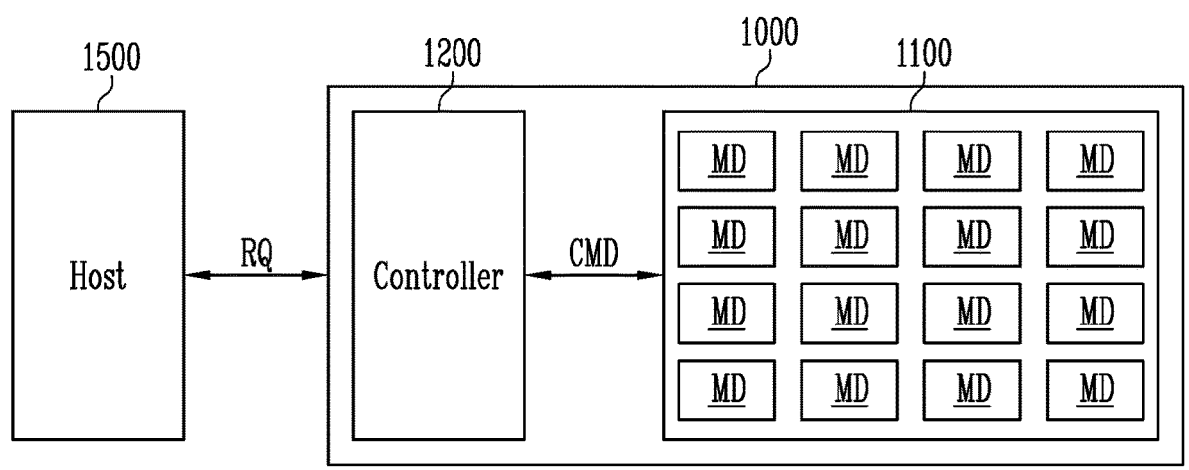
FIG. 1 is a diagram illustrating a memory system according to an embodiment of the present disclosure.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

FIG. 1 is a diagram illustrating a memory system according to an embodiment of the present disclosure.

Referring to FIG. 1, the memory system 1000 may include a storage device 1100 and a controller 1200.

The host 1500 may generate requests RQ for various operations and may output the generated requests RQ to the memory system 1000. For example, the requests RQ may include a program request that may control a program operation, a read request that may control a read operation, an erase request that may control an erase operation, and the like.

The host 1500 may communicate with the memory system 1000 through various interfaces such as peripheral component interconnect express (PCIe), advanced technology attachment (ATA), serial ATA (SATA), parallel ATA (PATA), serial attached SCSI (SAS), nonvolatile memory express (NVMe) a universal serial bus (USB), a multi-media card (MMC), an enhanced small disk interface (ESDI), or integrated drive electronics (IDE).

The controller 1200 may communicate between the host 1500 and the memory device MD. The controller 1200 may generate a command CMD for controlling the memory devices MD according to the request RQ of the host 1500, and even though the request RQ of the host 1500 is not present, the controller 1200 may perform a background operation for improving performance of the system 1000. During a read operation, the controller 1200 may receive a logical address from the host 1500 and output a physical address mapped to the logical address to the storage device 1100. The physical address is an address of an area in which data is stored in the storage device 1100.

The storage device 1100 may include a plurality of memory devices MD, and the memory devices MD may be connected to the controller 1200 through channels. The memory devices MD may perform the program operation, the read operation, the erase operation, and the like in response to the command CMD received through the channel.

Figure 2:
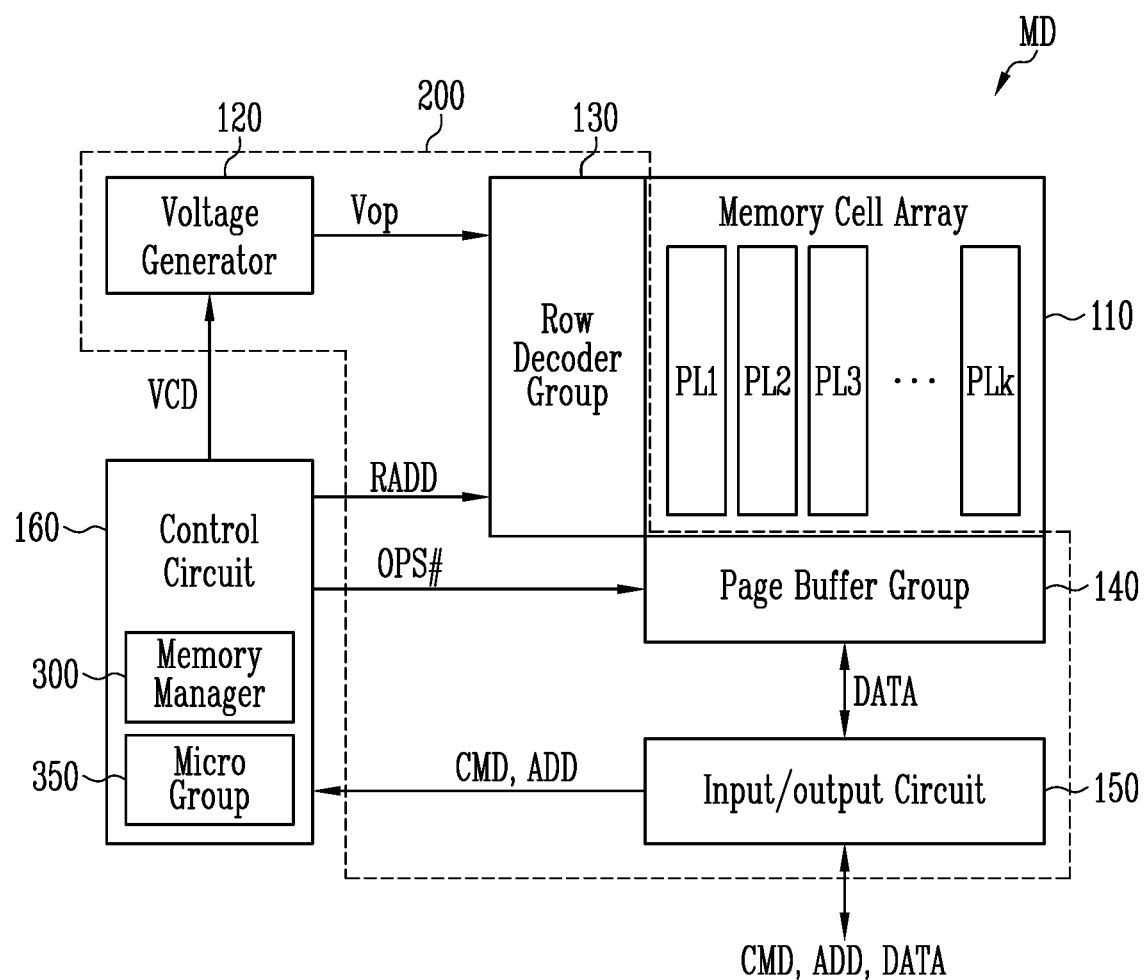
FIG. 2 is a diagram illustrating a memory device according to an embodiment of the present disclosure.

FIG. 2 is a diagram illustrating a memory device according to an embodiment of the present disclosure.

Referring to FIG. 2, the memory device MD may include a memory cell array 110 in which data is stored, a peripheral circuit 200 that performs the program, read, or erase operation, and a control circuit (logic circuit) 160 that controls the peripheral circuit 200.

The memory cell array 110 may include planes PL1 to PLk (k is a positive integer) in which data is stored. The plane may be a unit of an area accessed when the program, read or erase operation is performed. The memory cell array 110 may be formed in a single plane structure including one plane, but in the present embodiment, the memory cell array 110 formed in a multi-plane structure including the plurality of planes PL1 to PLk is described as an embodiment. Each of the planes PL1 to PLk may include a plurality of memory blocks, and each of the plurality of memory blocks may include a plurality of memory cells. The memory blocks may store user data and meta data required for the operation of the memory device MD. The memory blocks may be implemented in a two-dimensional or three-dimensional structure. The memory blocks having the two-dimensional structure may include memory cells arranged parallel to a substrate, and the memory blocks having the three-dimensional structure may include memory cells stacked perpendicular to the substrate.

The peripheral circuit 200 may include a voltage generator 120, a row decoder group 130, a page buffer group 140, and an input/output circuit 150.

The voltage generator 120 may generate and output operation voltages Vop required for various operations in response to a voltage code VCD. For example, the voltage generator 120 may generate a program voltage, a verify voltage, a read voltage, a pass voltage, an erase voltage, and the like having various levels, and output the generated voltages as operation voltages Vop.

The row decoder group 130 may be configured to transfer the operation voltages Vop to the planes PL1 to PLk included in the memory cell array 110 according to a row address RADD. For example, the row decoder group 130 may include row decoders corresponding to each of the planes PL1 to PLk, and transfer the operation voltages Vop to a selected memory block included in each of the planes PL1 to PLk.

The page buffer group 140 may be connected to the planes PL1 to PLk through bit lines. For example, the page buffer group 140 may include a plurality of page buffers for independently operating the planes PL1 to PLk in response to operation signals OPS #. During the program operation, the page buffers may temporarily store data received from the input/output circuit 150, and may adjust a voltage of the bit lines according to the temporarily stored data. During the read operation, the page buffers may temporarily store data read from selected memory cells, and may output the temporarily stored data to the input/output circuit 150.

The input/output circuit 150 may be connected to the controller 1200 of FIG. 1 through input/output lines. The input/output circuit 150 may input/output the command CMD, an address ADD, and data DATA through the input/output lines. For example, the input/output circuit 150 may transmit the command CMD and the address ADD received through the input/output lines to the control circuit 160, and transmit the data DATA received through the input/output lines to the page buffer group 140. The input/output circuit 150 may output the data DATA received from the page buffer group 140 to the controller 1200 through the input/output lines.

The control circuit 160 may output the voltage code VCD, the row address RADD, the page buffer control signals PBSIG, and a column address CADD in response to the command CMD and the address ADD. For example, the control circuit 160 may include software that performs an algorithm in response to the command CMD, and hardware configured to output various signals according to the address ADD and the algorithm.

The control circuit 160 may be configured to control the peripheral circuit 200 in response to the command CMD and the address ADD. For example, the control circuit 160 may output the voltage code VCD, the row address RADD, and the operation signals OPS # in response to the command CMD and the address ADD.

The control circuit 160 may include a micro-control circuit group 350 for outputting the operation signals OPS # and a memory manager 300 in which control codes are stored. The micro-control circuit group 350 may include a plurality of micro-control circuits, and the plurality of micro-control circuits may be configured to output the operation signals OPS # in response to the control code output from the memory manager 300. For example, the control codes may include codes for performing the program operation, the read operation, or the erase operation, and may include codes for performing a plane interleaving operation. The plurality of micro-control circuits may include circuits configured to output the operation signals OPS # in response to the control code. The memory manager 300 may include one control memory in which the control codes are stored, and hardware and software configured to output the control codes, which are stored in the control memory, according to an order of selected planes. The control memory may be a read only memory (ROM), a programmable ROM (PROM), an electrically programmable ROM (EPROM), an electrically erasable and programmable ROM (EEPROM), and the like, and may be positioned outside the control circuit 160 according to the memory device MD.

Figure 3:
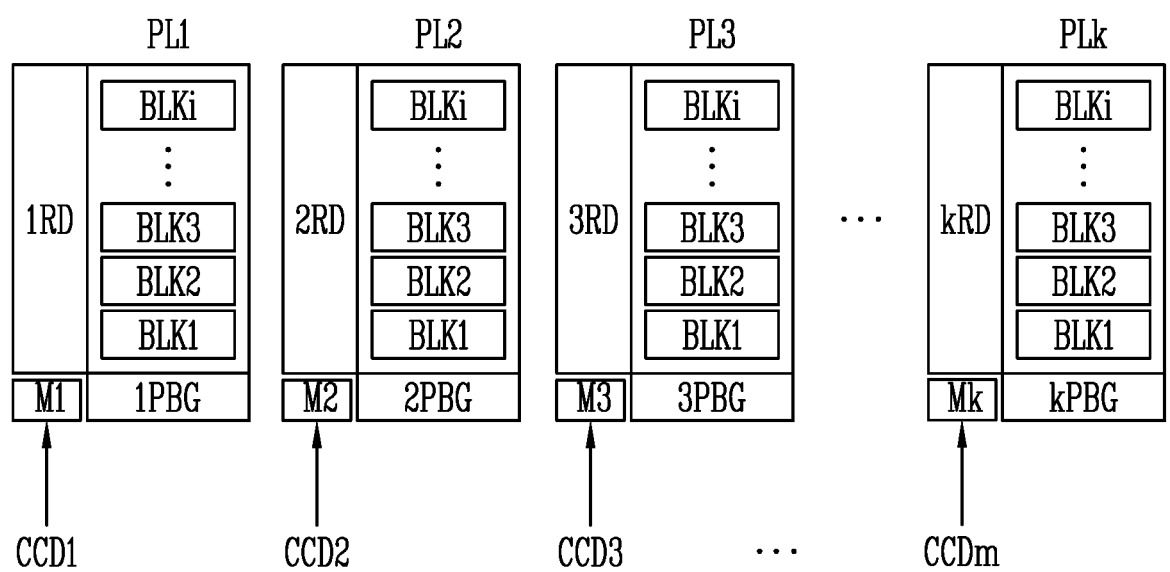
FIG. 3 is a diagram illustrating a multi-plane structure according to an embodiment of the present disclosure.

FIG. 3 is a diagram illustrating a multi-plane structure according to an embodiment of the present disclosure.

Referring to FIGS. 2 and 3, the memory device MD having the multi-plane structure may include the plurality of planes PL1 to PLk. For example, the first to k-th planes PL1 to PLk may be included in one memory device MD.

Each of the first to k-th planes PL1 to PLk may be connected to row decoders 1RD to kRD and page buffer groups 1PBG to kPBG, and may operate independently. For example, the first plane PL1 may be connected to the first row decoder 1RD and the first page buffer group 1PBG and may operate, the second plane PL2 may be connected to the second row decoder 2RD and the second page buffer group 2PBG and may operate, the third plane PL3 may be connected to the third row decoder 3RD and the third page buffer group 3PBG and may operate, and the k-th plane PLk may be connected to the k-th row decoder kRD and the k-th page buffer group kPBG and may operate.

When describing the read operation as an example, each of the first to k-th row decoders 1RD to kRD may apply the read voltage to the memory block selected from each of the first to k-th planes PL1 to PLk in response to the received row address. The first to k-th page buffer groups 1PBG to kPBG may temporarily store read data by sensing a voltage or a current of the bit lines connected to the first to k-th planes PL1 to PLk. When all sensing operations of the first to k-th planes PL1 to PLk are completed, the read data temporarily stored in the first to k-th page buffer groups 1PBG to kPBG may be sequentially output through the input/output circuit 150. For example, after the read data stored in the first page buffer group 1PBG is output, the read data stored in the second to k-th page buffer groups 2PBG to kPBG may be sequentially output.

The memory device MD including the plurality of planes PL1 to PL4 may simultaneously perform the read, program, or erase operation on the memory blocks or pages positioned in different planes. For example, the controller 1200 of FIG. 1 may transmit the command CMD instructing the read operation to the control circuit 160, and the control circuit 160 may control the peripheral circuit 200 to simultaneously read the memory blocks or pages included in different planes in response to the command CMD. For example, the control circuit 160 may include first to k-th micro-control circuits M1 to Mk to control the peripheral circuit 200 in a plane interleaving method.

The first to k-th micro-control circuits M1 to Mk may be circuits included in the micro-control circuit group 350 and may be configured to control the first to k-th planes PL1 to PLk, respectively. Each of the first to k-th micro-control circuits M1 to Mk may control the first to k-th row decoders 1RD to kRD and the first to k-th page buffer groups 1PBG to kPBG in response to first to m-th control codes CCD1 to CCDm output from the memory manager 300. For example, the first micro-control circuit M1 may control the first row decoder 1RD and the first page buffer group 1PBG, the second micro-control circuit M2 may control the second row decoder 2RD and the second page buffer group 2PBG, the third micro-control circuit M3 may control the third row decoder 3RD and the third page buffer group 3PBG, and the k-th micro-control circuit Mk may control the k-th row decoder kRD and the k-th page buffer group kPBG. For example, when a plurality of logical page data are stored in the memory cells, the first to m-th control codes CCD1 to CCDm may be codes for reading the plurality of logical page data. For example, the first to m-th control codes CCD1 to CCDm may include a code for performing a least significant bit read operation, a code for performing a central significant bit read operation, or a code for performing a most significant bit read operation.

The least significant bit, the central significant bit, and the most significant bit may be changed according to a method in which the memory cells are programmed. This is specifically described with reference to FIG. 4.

Figure 4:
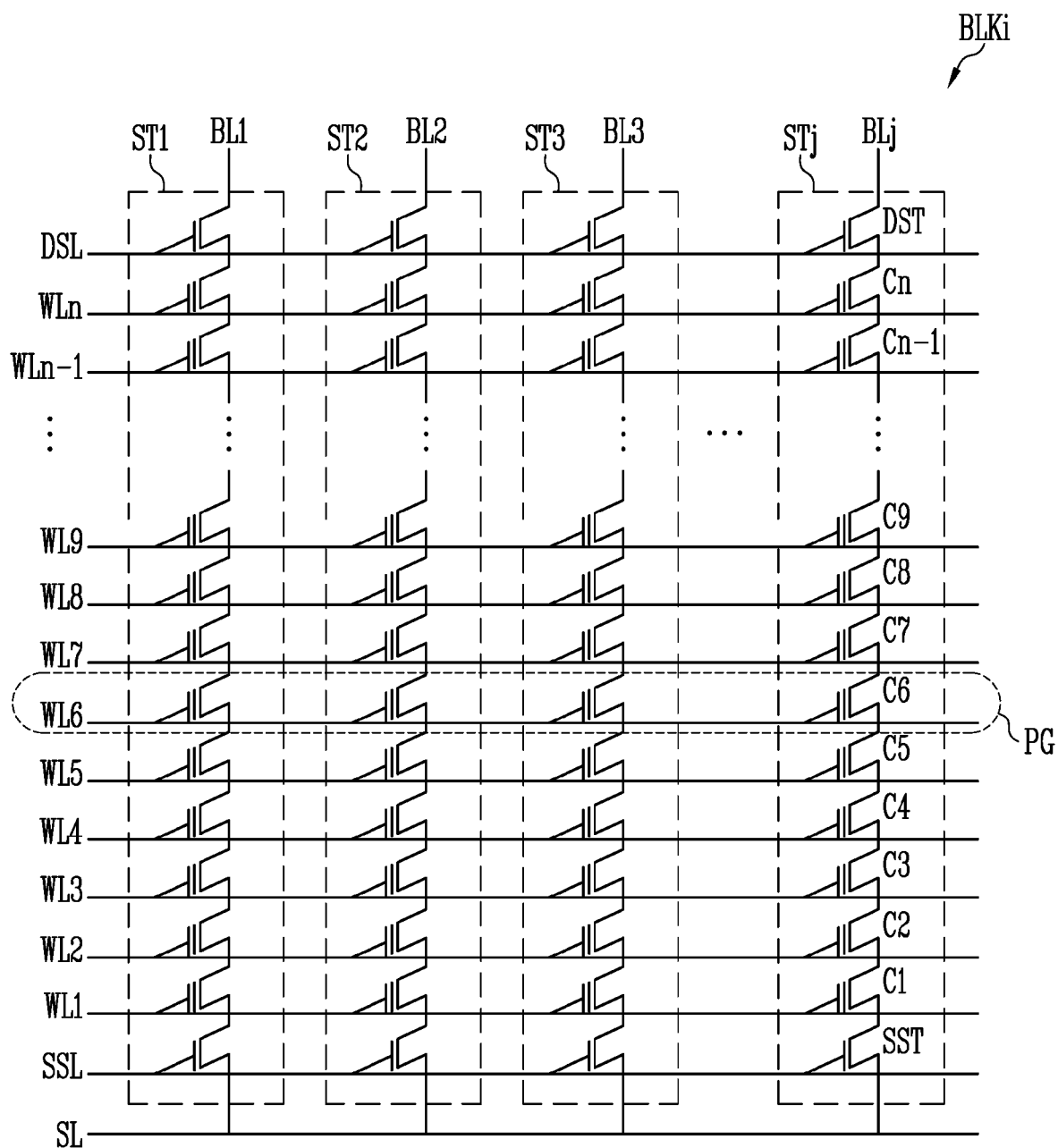
FIG. 4 is a diagram illustrating a memory block according to an embodiment of the present disclosure.

FIG. 4 is a diagram illustrating a memory block, and an i-th memory block BLKi is shown as an example among the plurality of memory blocks BLK1 to BLKi shown in FIG. 3 according to an embodiment of the present disclosure.

Referring to FIG. 4, the i-th memory block BLKi may include a plurality of strings ST1 to STj (j is a positive integer). The first to j-th strings ST1 to STj may be connected between bit lines BL1 to BLj and a source line SL. For example, the first string ST1 may be connected between the first bit line BL1 and the source line SL, the second string ST2 may be connected between the second bit line BL2 and the source line SL, and the j-th string STj may be connected between the j-th bit line BLj and the source line SL.

Each of the first to j-th strings ST1 to STj may include a source select transistor SST, a plurality of memory cells C1 to Cn, and a drain select transistor DST. Although not shown in the drawing, dummy cells may be further included between the memory cells C1 to Cn and the source or drain select transistors SST or DST. A configuration of the string is specifically described as follows using the j-th string STj as an example.

The source select transistor SST included in the j-th string STj may electrically connect or disconnect between the source line SL and the first memory cell C1 according to a voltage applied to the source select line SSL. Gates of the first to n-th memory cells C1 to Cn may be connected to first to n-th word lines WL1 to WLn, respectively. The drain select transistor DST may electrically connect or disconnect between the j-th bit line BLj and the n-th memory cell Cn according to a voltage applied to the drain select line DSL. Gates of the source select transistors SST included in the different strings ST1 to STj may be commonly connected to the source select line SSL, and gates of the first to n-th memory cells C1 to Cn may be connected to the first to n-th word lines WL1 to WLn, and gates of the drain select transistors DST may be commonly connected to the drain select line DSL. A group of memory cells connected to the same word line is referred to as a page PG, and the program and read operations may be performed in a unit of the page PG.

The memory cells may be programmed in various methods according to the number of bits stored in one memory cell, and the read operation may be performed in the same method as the program method. For example, a method in which one bit of data is stored in one memory cell may be referred to as a single level cell method, a method in which two bits of data is stored in one memory cell may be referred to as a multi-level cell method, a method in which three bits of data is stored in one memory cell may be referred to as a triple level cell method, and a method in which four bits of data is stored in one memory cell may be referred to as a quadruple level cell method. In addition, the memory cells may be programmed in various methods according to the number of bits stored in one memory cell.

When describing the multi-level cell method as an example, in the program operation of the multi-level cell method, two bits of data may be stored in one memory cell. The two bits of data becomes two different logical page data. The different logical page data may include least significant bit data and most significant bit data. Therefore, the read operation of the memory cells programmed in the multi-level cell method may also be performed on different logical page data. For example, an operation of reading the least significant bit data and an operation of reading the most significant bit data may be performed.

When describing the triple level cell method as an example, in the program method of the triple level cell, three bits of data may be stored in one memory cell. The three bits of data become three different logical page data. The different logical page data may include least significant bit data, central significant bit data, and most significant bit data. Therefore, the read operation of the memory cells programmed in the triple level cell method may also be performed on the different logical page data. For example, an operation of reading the least significant bit data, an operation of reading the central significant bit data, and an operation of reading the most significant bit data may be performed. That is, the read operation on the memory cells may be performed as many times as the number of logical page data stored in the memory cells.

Figure 5:
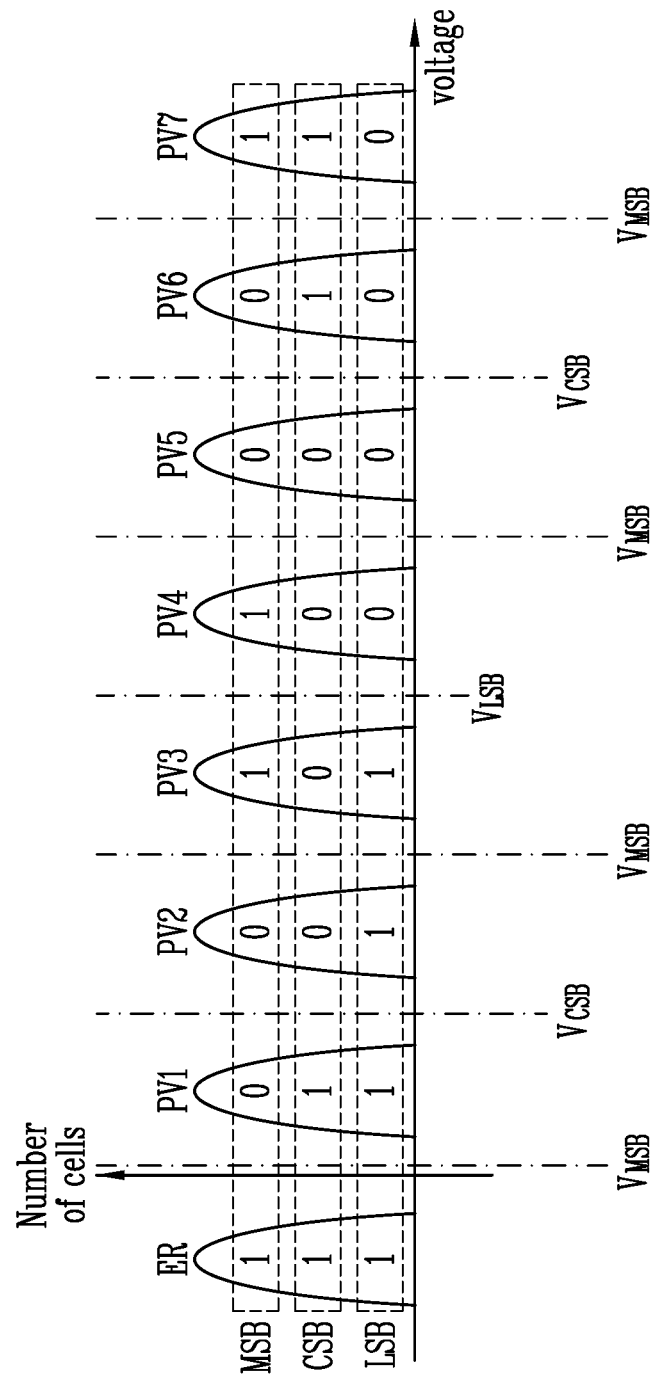
FIG. 5 is a diagram illustrating a threshold voltage distribution of memory cells according to an embodiment of the present disclosure.

FIG. 5 is a diagram illustrating a threshold voltage distribution of memory cells according to an embodiment of the present disclosure.

Referring to FIG. 5, different logical page data stored in the memory cells may be expressed by a gray code. When describing a gray code of the triple level cell method as an example, in the triple level cell method, logical page data corresponding to a least significant bit (LSB), a central significant bit (CSB), and a most significant bit (MSB) may be stored in one memory cell. Each of the LSB data, the CSB data, and the MSB data may become different logical page data, and may be expressed as 0 or 1. Here, 0 or 1 is the gray code. The gray code may be arranged in an order of the LSB, the CSB, and the MSB, and may be expressed in various combinations. For example, an erase state ER may be expressed as '111', a first program state PV1 may be expressed as '110', and the second program state PV2 may be expressed as '100'. The gray code shown in FIG. 5 corresponds to an embodiment, and may be set in various combinations according to the memory device.

In the read operation of the triple level cell method, an LSB read operation using an LSB read voltage $V_{LSB}$, a CSB read operation using a CSB read voltage $V_{CSB}$, and an MSB read operation using an MSB read voltage $V_{MSB}$ with respect to the selected page may be performed.

Figure 6:
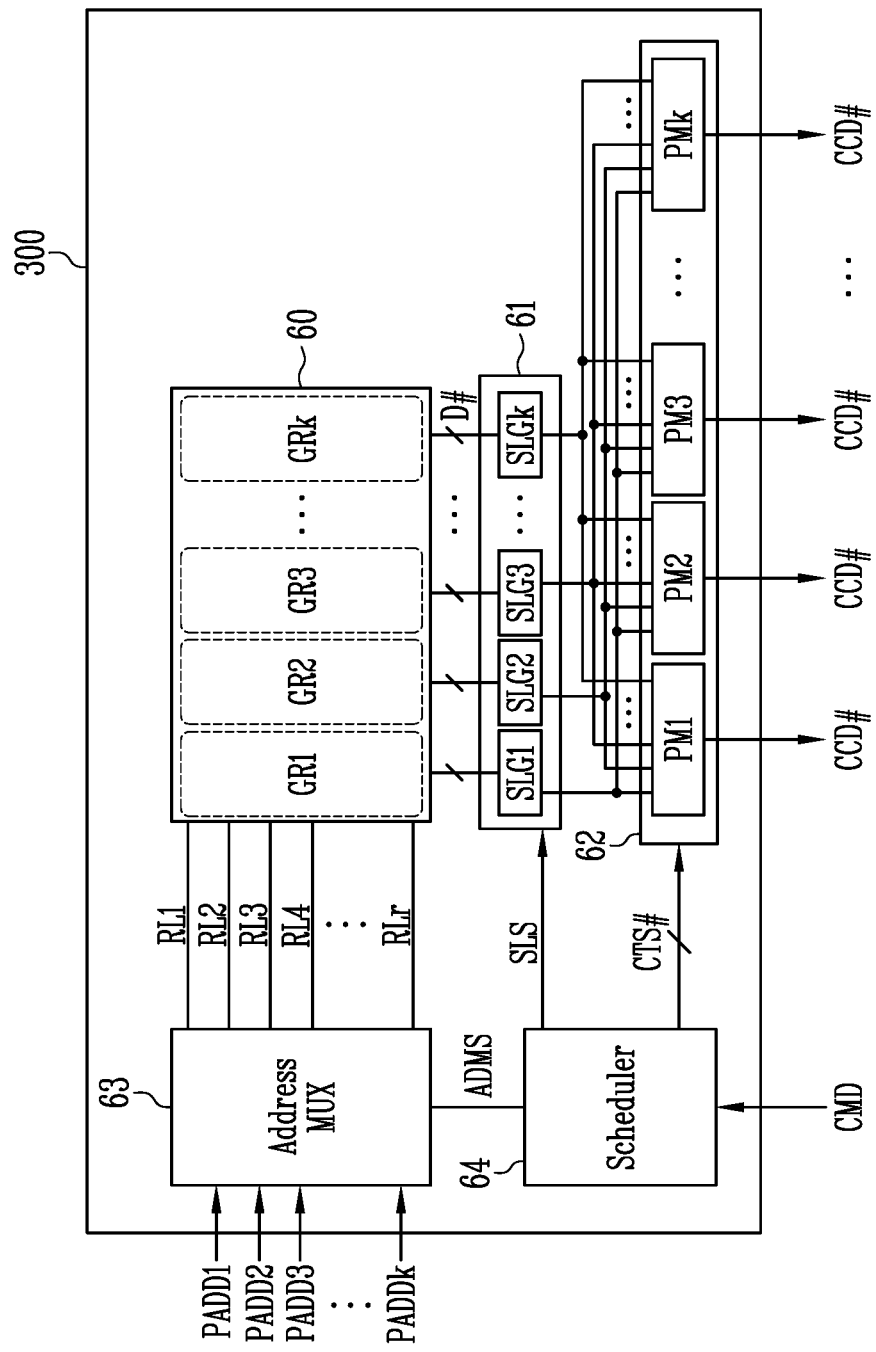
FIG. 6 is a diagram illustrating a memory manager according to an embodiment of the present disclosure.

FIG. 6 is a diagram illustrating a memory manager according to an embodiment of the present disclosure.

Referring to FIG. 6, the memory manager 300 may be configured to output a plurality of control codes CCD # for controlling each plane in response to the command CMD. The memory manager 300 may include a control memory 60, a latch group 61, a plane MUX group 62, an address MUX 63, and a scheduler 64.

The control memory 60 may be configured to store various control codes for controlling the peripheral circuits according to the command. For example, memory cells included in the control memory 60 may be configured of cells on which only the read operation is performed, and may be configured of cells on which re-programming may be performed in some cases. For example, the control memory 60 may be configured of a read only memory (ROM), a programmable ROM (PROM), an electrically programmable ROM (EPROM), an electrically erasable and programmable ROM (EEPROM), and the like. Therefore, the memory manager 300 may only perform the read operation on the control memory 60 after the control codes CCD # are stored in the control memory 60.

The control memory 60 may be configured of one cell array regardless of the number of planes. In some memory devices that have been proposed, a plurality of control memories are used and the number of the control memories correspond to the number of planes. However, in the present embodiment, a single control memory 60 may be used to cover the plurality of planes. In order to perform the read operation on the plurality of planes in an interleaving method, the memory cells included in the control memory 60 may be divided into first to k-th memory groups GR1 to GRk. The control codes CCD # for controlling an operation of the first plane may be stored in the first memory group GR1, the control codes CCD # for controlling an operation of the second plane may be stored in the second memory group GR2, the control codes CCD # for controlling an operation of the third plane may be stored in the third memory group GR3, and the control codes CCD # for controlling an operation of the k-th plane may be stored in the k-th memory group GRk. The memory cells included in the first to k-th memory groups GR1 to GRk may be commonly connected to each of first to r-th row lines RL1 to RLr physically, and may be divided into the first to k-th memory groups GR1 to GRk logically. For example, the memory cells connected to the first row line RL1 may be divided into the first to k-th memory groups GR1 to GRk, and the memory cells connected to the r-th row line RLr may be divided into the first to k-th memory groups GR1 to GRk.

The latch group 61 may be connected to the first to k-th memory groups GR1 to GRk through data lines D # and may be configured to temporarily store the control codes CCD # read from the first to k-th memory groups GR1 to GRk. For example, the latch group 61 may include first to k-th sub latch groups SLG1 to SLGk. The first sub latch group SLG1 may include latches capable of temporarily storing the control codes CCD # read from the first memory group GR1, and the second sub latch group SLG2 may include latches capable of temporarily storing the control codes CCD # read from the second memory group GR2. In such a method, the k-th sub latch group SLCk may include latches capable of temporarily storing the control codes CCD # read from the k-th memory group GRk. The first to k-th sub latch groups SLG1 to SLGk may simultaneously operate in response to a sub latch signal SLS.

The plane MUX group 62 may be configured to receive the control codes CCD #, which are temporarily stored in the latch group 61, in response to code transmission signals CTS and selectively output the received control codes CCD #. For example, the plane MUX group 62 may include first to k-th plane MUXes PM1 to PMk. The first to k-th plane MUXes PM1 to PMk may be connected to each of the first to k-th sub latch groups SLG1 to SLGk, commonly receive the control codes CCD # from each of the first to k-th sub latch groups SLG1 to SLGk in response to the code transmission signals CTS #, and selectively output the control codes CCD #.

The address MUX 63 may be configured to receive the first to k-th plane addresses PADD1 to PADDk and selectively output read voltages to the first to r-th row lines RL1 to RLr in response to an address MUX signal ADMS.

The scheduler 64 may include software capable of adjusting an output order of the control codes CCD # stored in the first to k-th memory groups GR1 to GRk, and hardware configured to output the address MUX signal ADMS, the sub latch signal SLS, and the code transmission signals CTS # according to the output order, in order to perform the plane interleaving operation in response to the command CMD. For example, when a read command CMD for the first to k-th planes is input, the scheduler 64 may output the address MUX signal ADMS, the sub latch signal SLS, and the code transmission signals CTS # so that the control code CCD # read from the first memory group GR1 is output in order to perform the read operation on the first plane, and then the control code CCD # read from the second memory group GR2 is output in order to perform the read operation on the second plane.

Structures of the first to k-th memory groups GR1 to GRk and the plane interleaving operation are specifically described as follows.

Figure 7:
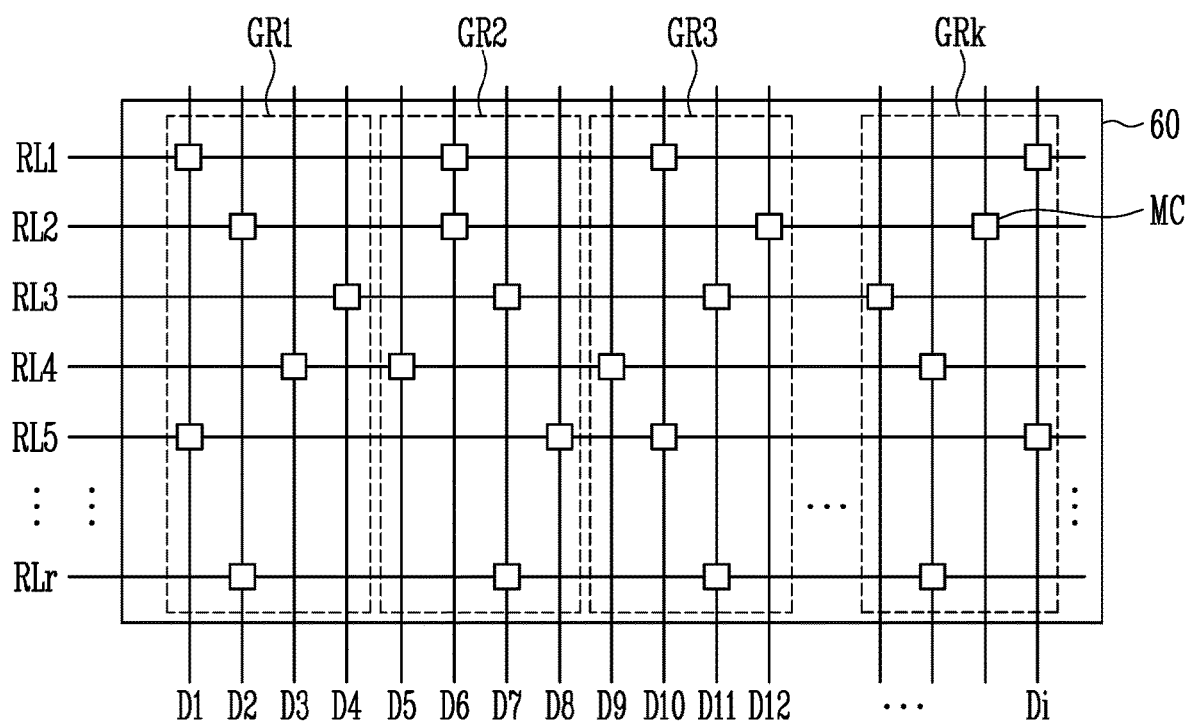
FIG. 7 is a diagram illustrating a control memory according to an embodiment of the present disclosure.

FIG. 7 is a diagram illustrating a control memory according to an embodiment of the present disclosure.

Referring to FIG. 7, the control memory 60 may include a plurality of memory cells MC for storing the control code. The plurality of memory cells MC may be connected between some of the first to r-th row lines RL1 to RLr and some of first to i-th data lines D1 to Di. Since the memory device may be operated according to the control code stored in the control memory 60, the memory cells MC may be connected to some areas where the first to r-th row lines RL1 to RLr and the first to i-th data lines D1 to Di overlap in order to prevent reliability reduction of the control memory 60. When a distance between the memory cells MC included in the control memory 60 increases, interference between the memory cells MC decreases, and thus the reliability reduction of the control memory 60 may be prevented.

In FIG. 7, the cells connected to the first to r-th row lines RL1 to RLr are included one by one among the memory cells MC included in the first to k-th memory groups GR1 to GRk. However, in the present embodiment, a structure of the control memory 60 is not limited to a structure shown in FIG. 7.

FIGS. 8A to 8E are diagrams illustrating a method of outputting control codes for performing a read operation of a selected plane according to an embodiment of the present disclosure.

Referring to FIGS. 8A to 8E, the memory device includes four planes PL1 to PL4. When the memory device includes the four planes PL1 to PL4, the memory cells included in the control memory 60 may also be divided into four memory groups GR1 to GR4. For example, different control codes CCD1, CCD2, CCD3, CCD4, . . . for controlling an operation of each of the first to fourth planes PL1 to PL4 may be stored in the first to fourth memory groups GR1 to GR4. For example, the first control code CCD1 may be a code for performing a LSB read operation LSB_R on each of the first to fourth planes PL1 to PL4, the second control code CCD2 may be a code for performing a CSB bit read operation CSB_R on each of the first to fourth planes PL1 to PL4, and the third control code CCD3 may be a code for performing an MSB read operation MSB_R on each of the first to fourth planes PL1 to PL4. In the present embodiment, the read operation of the triple level cell method is described as an example, but various control codes may be stored in the first to fourth memory groups GR1 to GR4.

The first to fourth memory groups GR1 to GR4, the first to fourth sub latch groups SLG1 to SLG4, and the first to fourth plane MUXes PM1 to PM4 are controlled by the scheduler 64 of FIG. 6, and in the description with reference to FIGS. 8A to 8E, a transmission order of the control codes is mainly described.

With reference to FIGS. 8A to 8E, a method of outputting the control code for controlling the operation of the first plane PL1 is described as an embodiment, and a method of outputting the control code for controlling the operation of the first to fourth planes PL1 to PL4 is described with reference to FIGS. 9A to 9E.

Figure 8A:
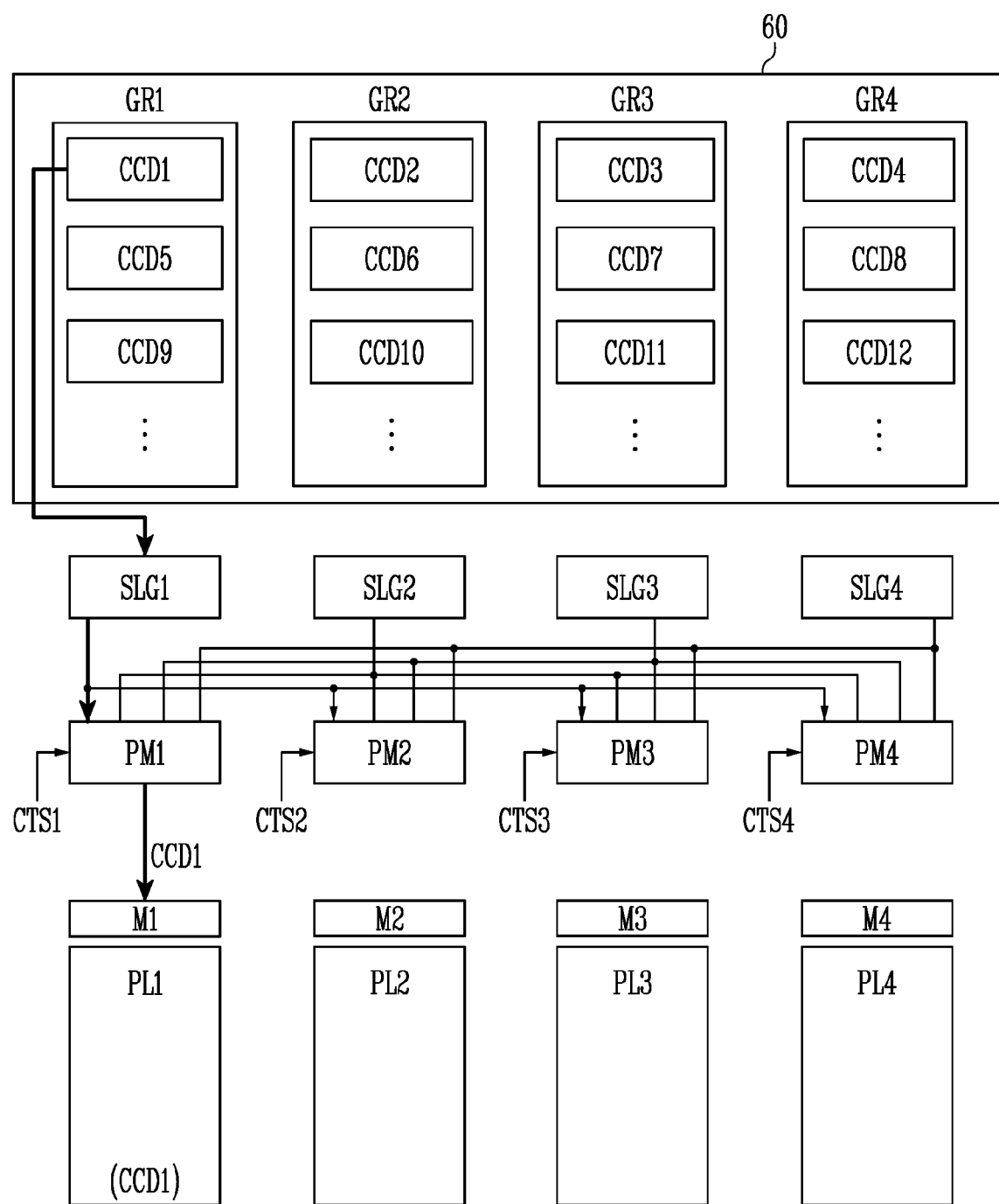
FIGS. 8A to 8E are diagrams illustrating a method of outputting control codes for performing a read operation of a selected plane according to an embodiment of the present disclosure.

Referring to FIG. 8A, the first control code CCD1 stored in the first memory group GR1 may be transmitted to the first sub latch group SLG1. The first control code CCD1 stored in the first sub latch group SLG1 may be transmitted to the first to fourth plane MUXes PM1 to PM4. In response to first to fourth code transmission signals CTS1 to CTS4, only the first plane MUX PM1 outputs the first control code CCD1, and the remaining second to fourth plane MUXes PM2 to PM4 do not output the first control code CCD1. The first control code CCD1 output from the first plane MUX PM1 may be transmitted to the first micro-control circuit M1. The first micro-control circuit M1 may sense the first control code CCD1 and control the peripheral circuits 1RD and 1PBG of FIG. 3 using the first control code CCD1 to perform the read operation of the first plane PL1.

Figure 8B:
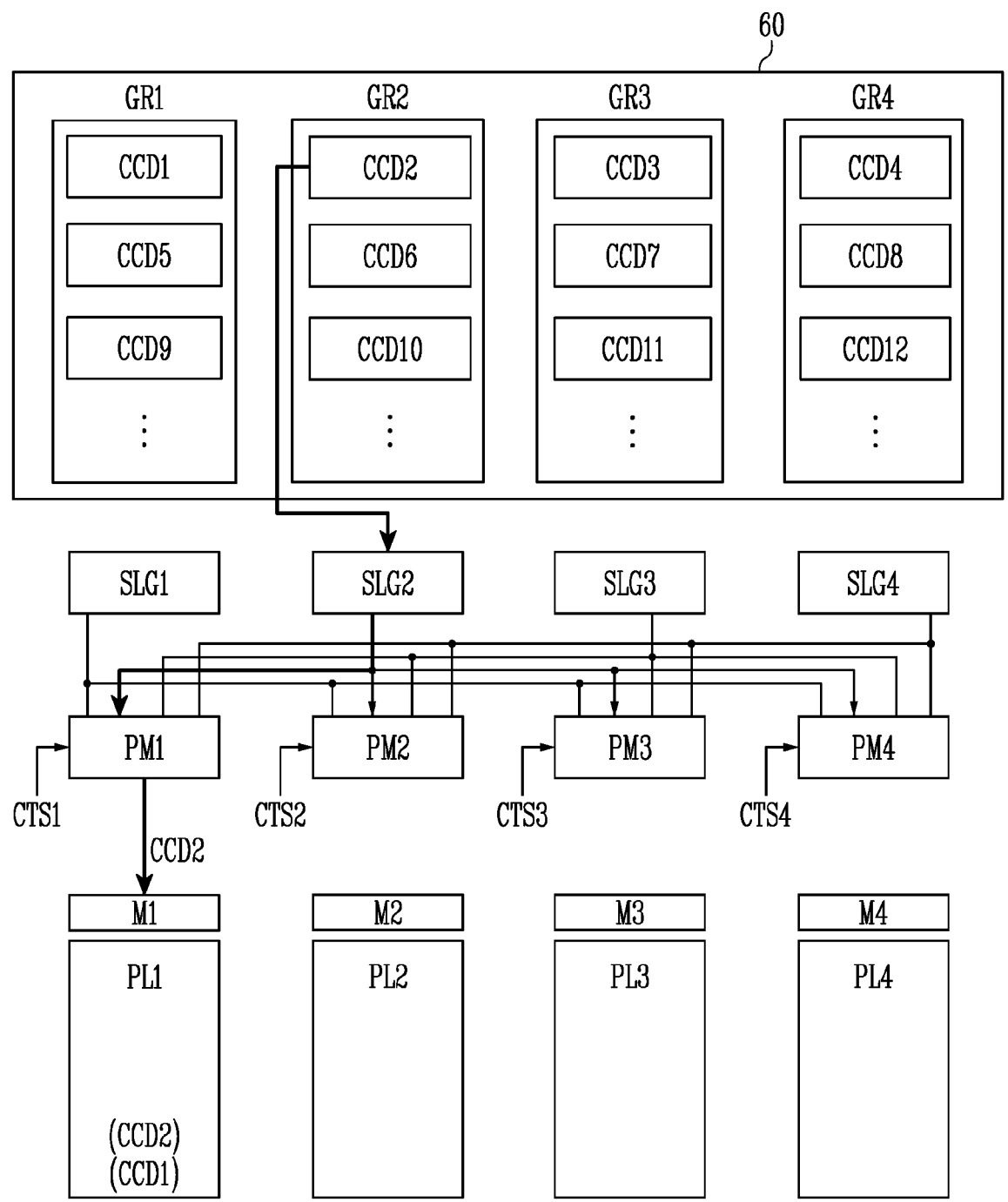

Referring to FIG. 8B, after the first control code CCD1 is output from the first micro-control circuit M1, the second control code CCD2 of the second memory group GR2 may be transmitted to the second sub latch group SLG2. The second control code CCD2 output from the second sub latch group SLG2 may be transmitted to the first to fourth plane MUXes PM1 to PM4, and the first plane MUX PM1 may output the second control code CCD2 in response to the first code transmission signal CTS1. The remaining second to fourth plane MUXes PM2 to PM4 do not output the second control code CCD2. The second control code CCD2 output from the first plane MUX PM1 may be transmitted to the first micro-control circuit M1. The first micro-control circuit M1 may sense the second control code CCD2 and may control the peripheral circuits 1RD and 1PBG of FIG. 3 using the second control code CCD2 to perform the read operation of the first plane PL1.

Figure 8C:
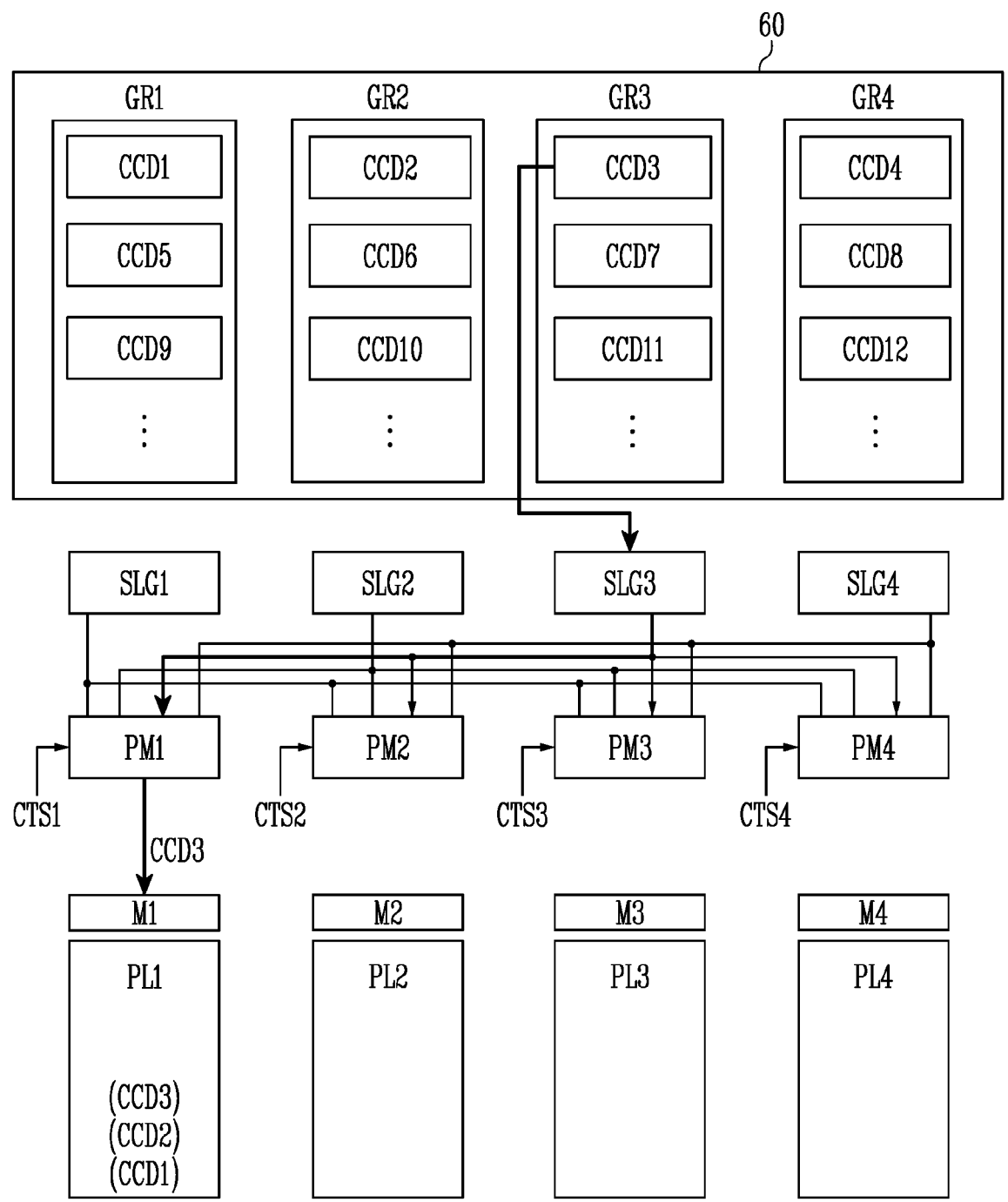

Referring to FIG. 8C, after the second control code CCD2 is output from the first micro-control circuit M1, the third control code CCD3 of the third memory group GR3 may be transmitted to the third sub latch group SLG3. The third control code CCD3 output from the third sub latch group SLG3 may be transmitted to the first to fourth plane MUXes PM1 to PM4, and the first plane MUX PM1 may output the third control code CCD3 in response to the first code transmission signal CTS1. The remaining second to fourth plane MUXes PM2 to PM4 do not output the third control code CCD3. The third control code CCD3 output from the first plane MUX PM1 may be transmitted to the first micro-control circuit M1. The first micro-control circuit M1 may sense the third control code CCD3 and control the peripheral circuits 1RD and 1PBG of FIG. 3 using the third control code CCD3 to perform the read operation of the first plane PL1.

Figure 8D:
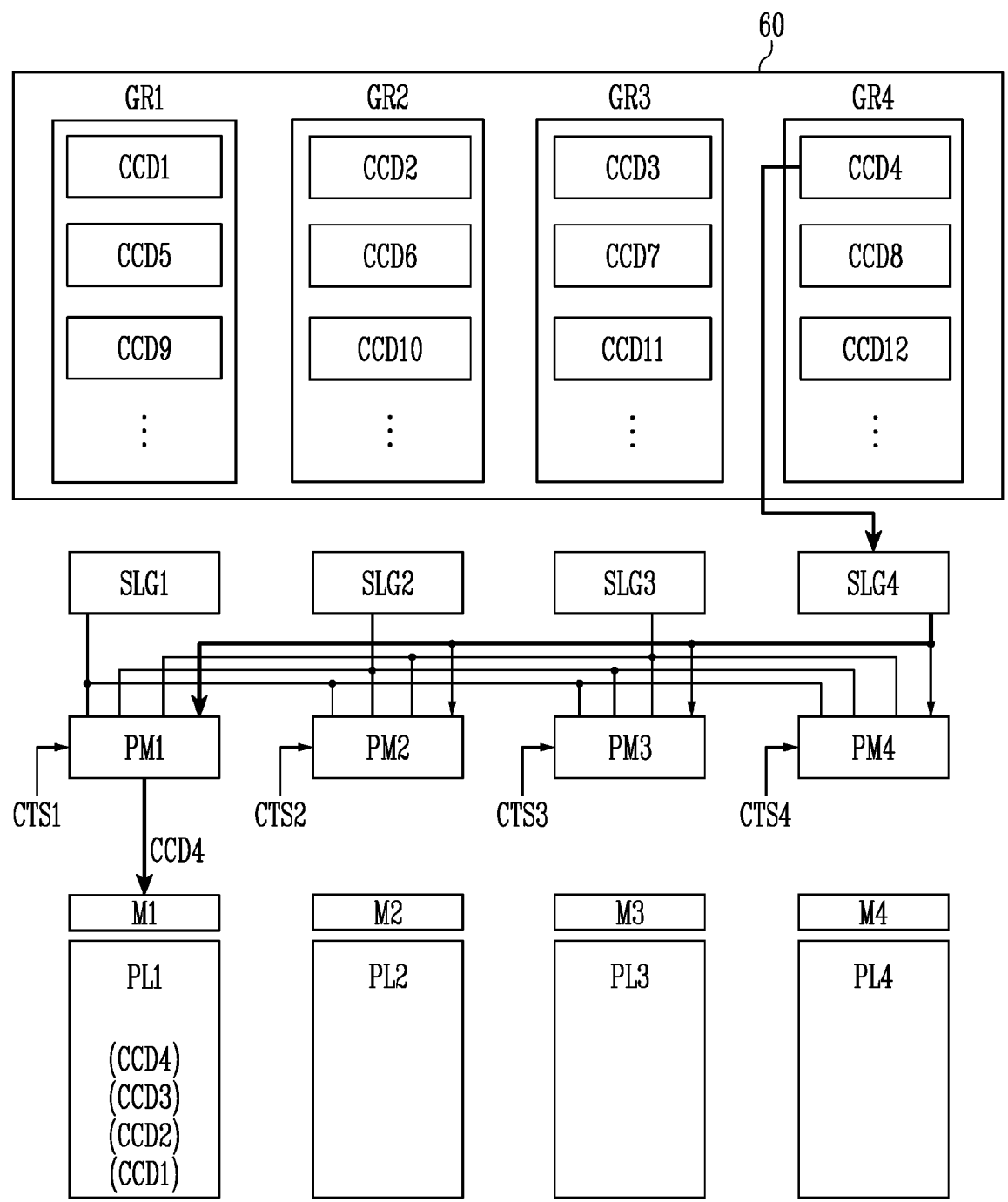

Referring to FIG. 8D, after the third control code CCD3 is output from the first micro-control circuit M1, the fourth control code CCD4 of the fourth memory group GR4 may be transmitted to the fourth sub latch group SLG4. The fourth control code CCD4 output from the fourth sub latch group SLG4 may be transmitted to the first to fourth plane MUXes PM1 to PM4, and the first plane MUX PM1 may output the fourth control code CCD4 in response to the first code transmission signal CTS1. The remaining second to fourth plane MUXes PM2 to PM4 do not output the fourth control code CCD4. The fourth control code CCD4 output from the first plane MUX PM1 may be transmitted to the first micro-control circuit M1. The first micro-control circuit M1 may sense the fourth control code CCD4 and control the peripheral circuits 1RD and 1PBG of FIG. 3 using the fourth control code CCD4 to perform the read operation of the first plane PL1.

Figure 8E:
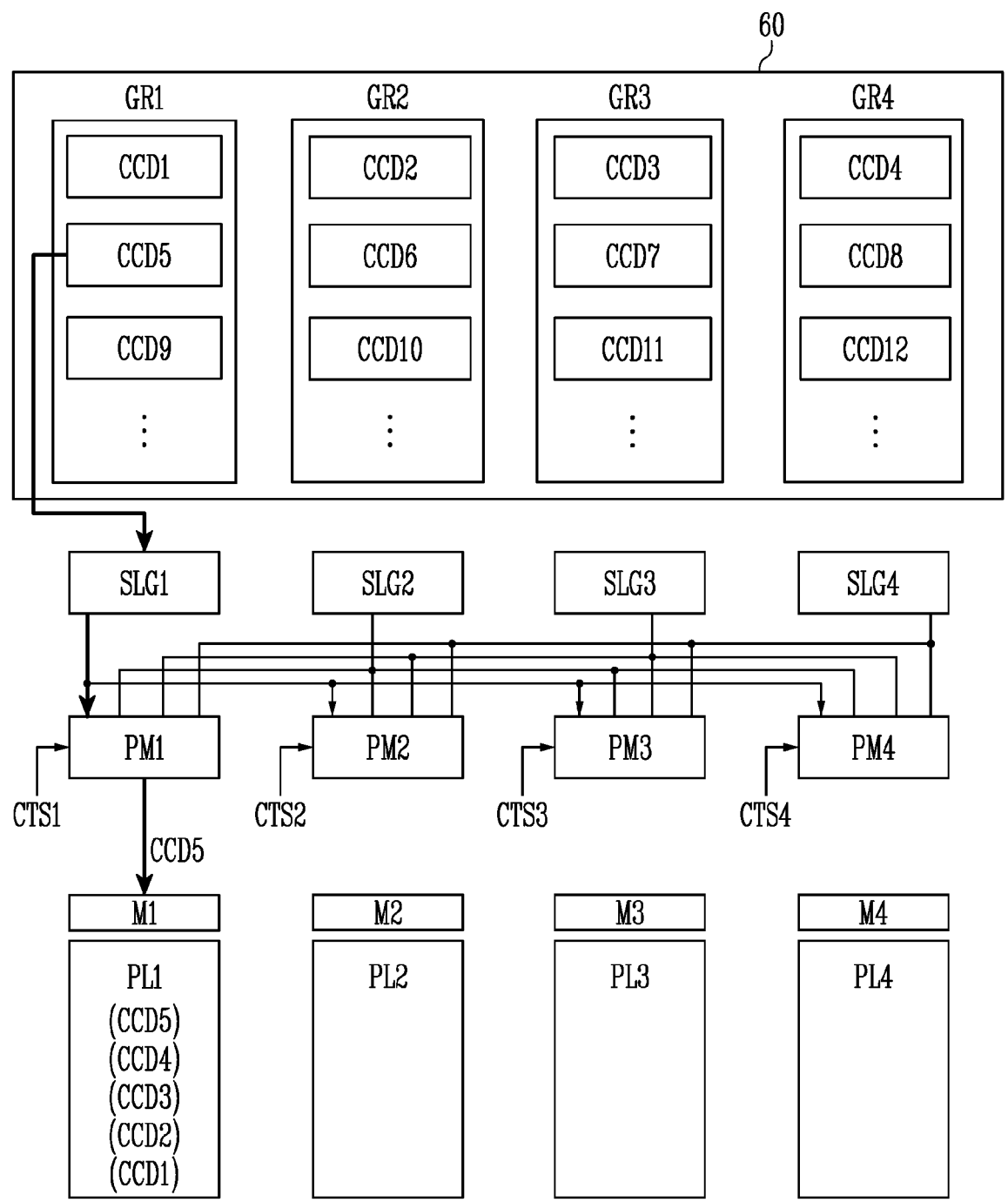

Referring to FIG. 8E, after the fourth control code CCD4 is output from the first micro-control circuit M1, the fifth control code CCD5 of the first memory group GR1 may be transmitted to the first sub latch group SLG1. The fifth control code CCD5 output from the first sub latch group SLG1 may be transmitted to the first to fourth plane MUXes PM1 to PM4, and the first plane MUX PM1 may output the fifth control code CCD5 in response to the first code transmission signal CTS1. The remaining second to fourth plane MUXes PM2 to PM4 do not output the fifth control code CCD5. The fifth control code CCD5 output from the first plane MUX PM1 may be transmitted to the first micro-control circuit M1. The first micro-control circuit M1 may sense the fifth control code CCD5 and control the peripheral circuits 1RD and 1PBG of FIG. 3 using the fifth control code CCD5 to perform the read operation of the first plane PL1.

As described above, the control codes output from the first to fourth memory groups GR1 to GR4 may be selectively transmitted to the first micro-control circuit M1 using the first to fourth plane MUXes PM1 to PM4. A method of outputting the control codes for controlling the read operations of the plurality of planes using the embodiment described with reference to FIGS. 8A to 8E is described as follows.

FIGS. 9A to 9E are diagrams illustrating a method of outputting control codes for sequentially performing read operations of a plurality of planes according to an embodiment of the present disclosure.

Figure 9A:
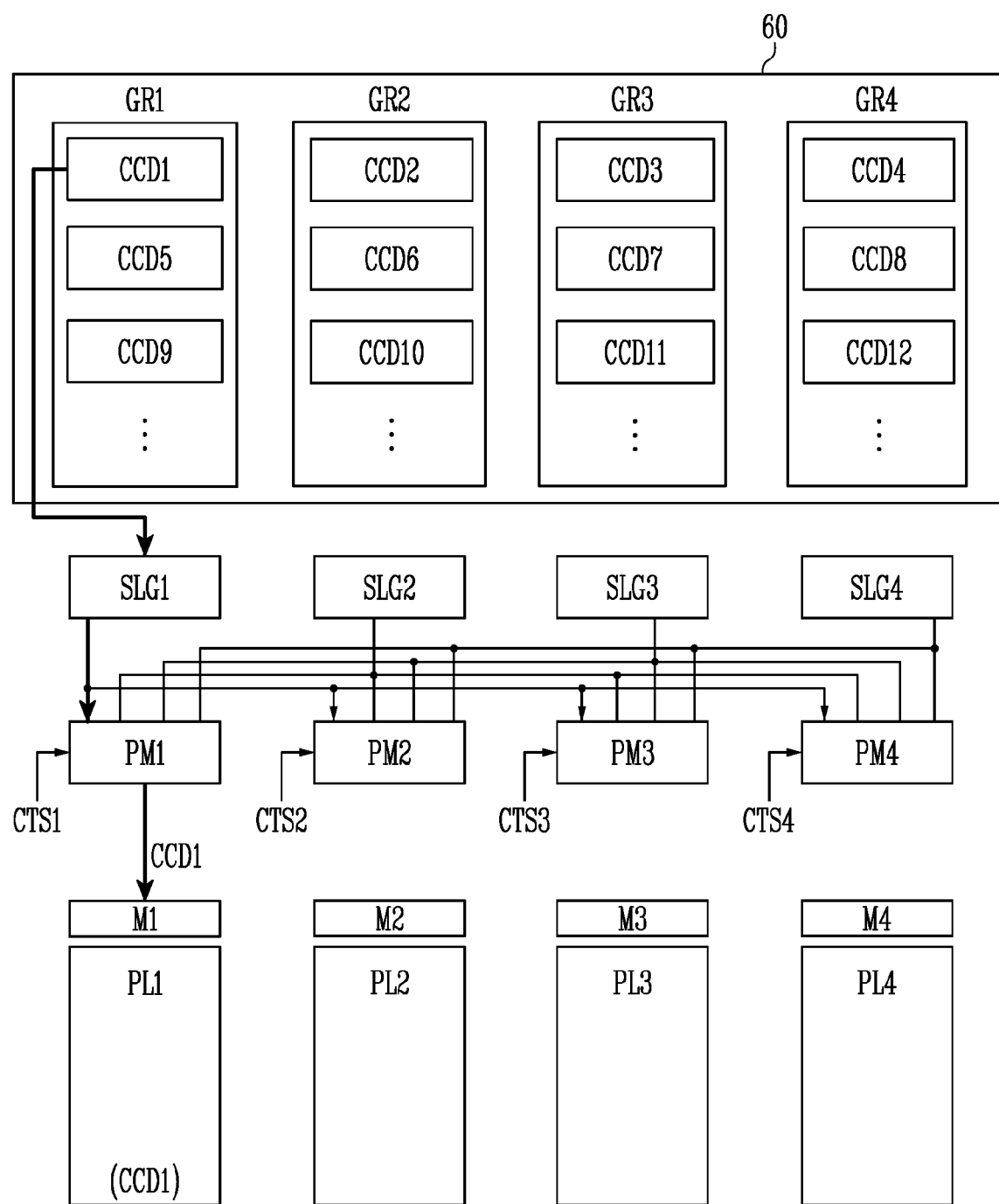
FIGS. 9A to 9E are diagrams illustrating a method of outputting control codes for sequentially performing read operations of a plurality of planes according to an embodiment of the present disclosure.

Referring to FIG. 9A, the first control code CCD1 stored in the first memory group GR1 may be transmitted to the first sub latch group SLG1. The first control code CCD1 stored in the first sub latch group SLG1 may be transmitted to the first to fourth plane MUXes PM1 to PM4. In response to the first to fourth code transmission signals CTS1 to CTS4, only the first plane MUX PM1 outputs the first control code CCD1, and the remaining second to fourth plane MUXes PM2 to PM4 do not output the first control code CCD1. The first control code CCD1 output from the first plane MUX PM1 may be transmitted to the first micro-control circuit M1. The first micro-control circuit M1 may sense the first control code CCD1 and control the peripheral circuits 1RD and 1PBG of FIG. 3 using the first control code CCD1 to perform the read operation of the first plane PL1.

Figure 9B:
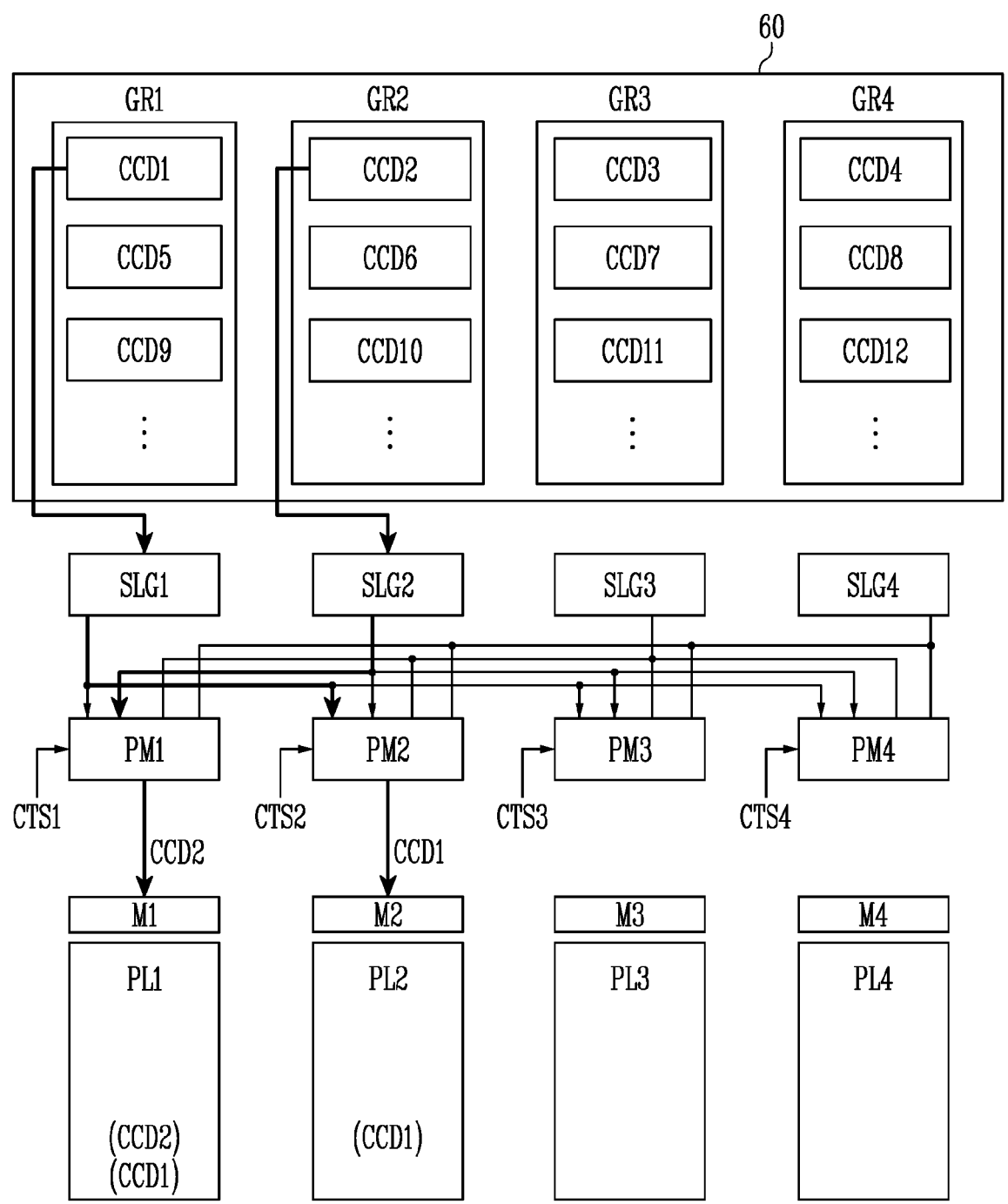

Referring to FIG. 9B, after the first control code CCD1 is output from the first micro-control circuit M1, the second control code CCD2 of the second memory group GR2 may be transmitted to the second sub latch group SLG2. At this time, the first control code CCD1 received from the first memory group GR1 may be maintained in the first sub latch group SLG1. The second control code CCD2 output from the second sub latch group SLG2 may be transmitted to the first to fourth plane MUXes PM1 to PM4, and the first plane MUX PM1 may output the second control code CCD2 in response to the first code transmission signal CTS1. The first control code CCD1 output from the first sub latch group SLG1 may be transmitted to the first to fourth plane MUXes PM1 to PM4, and the second plane MUX PM2 may output the first control code CCD1 in response to the second code transmission signal CTS2. The remaining third and fourth plane MUXes PM3 and PM4 do not output the first and second control codes CCD1 and CCD2. The second control code CCD2 output from the first plane MUX PM1 may be transmitted to the first micro-control circuit M1, and the first control code CCD1 output from the second plane MUX PM2 may be transmitted to the second micro-control circuit M2. The first micro-control circuit M1 may sense the second control code CCD2 and control the peripheral circuits 1RD and 1PBG of FIG. 3 using the second control code CCD2 to perform the read operation of the first plane PL1. The second micro-control circuit M2 may sense the first control code CCD1 and control the peripheral circuits 2RD and 2PBG of FIG. 3 using the first control code CCD1 to perform the read operation of the second plane PL2.

Figure 9C:
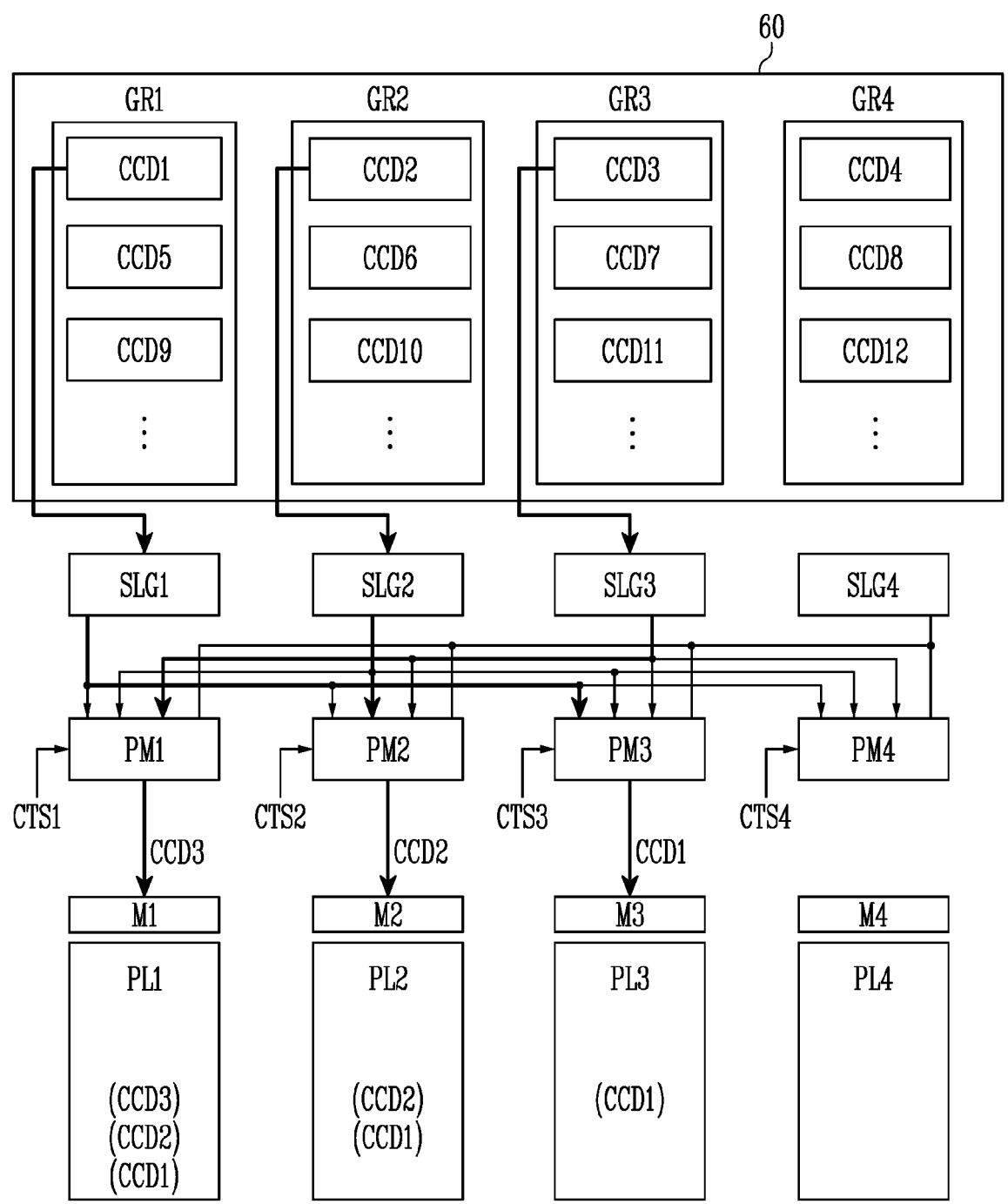

Referring to FIG. 9C, after the second and first control codes CCD2 and CCD1 are output from the first and second micro-control circuits M1 and M2, the third control code CCD3 of the third memory group GR3 may be transmitted to the third sub latch group SLG3. At this time, the first control code CCD1 received from the first memory group GR1 may be maintained in the first sub latch group SLG1, and the second control code CCD2 received from the second memory group GR2 may be maintained in the second sub latch group SLG2. The third control code CCD3 output from the third sub latch group SLG3 may be transmitted to the first to fourth plane MUXes PM1 to PM4, and the first plane MUX PM1 may output the third control code CCD3 in response to the first code transmission signal CTS1. The second control code CCD2 output from the second sub latch group SLG2 may be transmitted to the first to fourth plane MUXes PM1 to PM4, and the second plane MUX PM2 may output the second control code CCD2 in response to the second code transmission signal CTS2. The first control code CCD1 output from the first sub latch group SLG1 may be transmitted to the first to fourth plane MUXes PM1 to PM4, and the third plane MUX PM3 may output the first control code CCD1 in response to the third code transmission signal CTS3. The remaining fourth plane MUX PM4 does not output the first to third control codes CCD1 to CCD3. The third control code CCD3 output from the first plane MUX PM1 may be transmitted to the first micro-control circuit M1, the second control code CCD2 output from the second plane MUX PM2 may be transmitted to the second micro-control circuit M2, and the first control code CCD1 output from the third plane MUX PM3 may be transmitted to the third micro-control circuit M3. The first micro-control circuit M1 may sense the third control code CCD3 and control the peripheral circuits 1RD and 1PBG of FIG. 3 using the third control code CCD3 to perform the read operation of the first plane PL1. The second micro-control circuit M2 may sense the second control code CCD2 and control the peripheral circuits 2RD and 2PBG of FIG. 3 using the second control code CCD2 to perform the read operation of the second plane PL2. The third micro-control circuit M3 may sense the first control code CCD1 and control the peripheral circuits 3RD and 3PBG of FIG. 3 using the first control code CCD1 to perform the read operation of the third plane PL3.

Figure 9D:
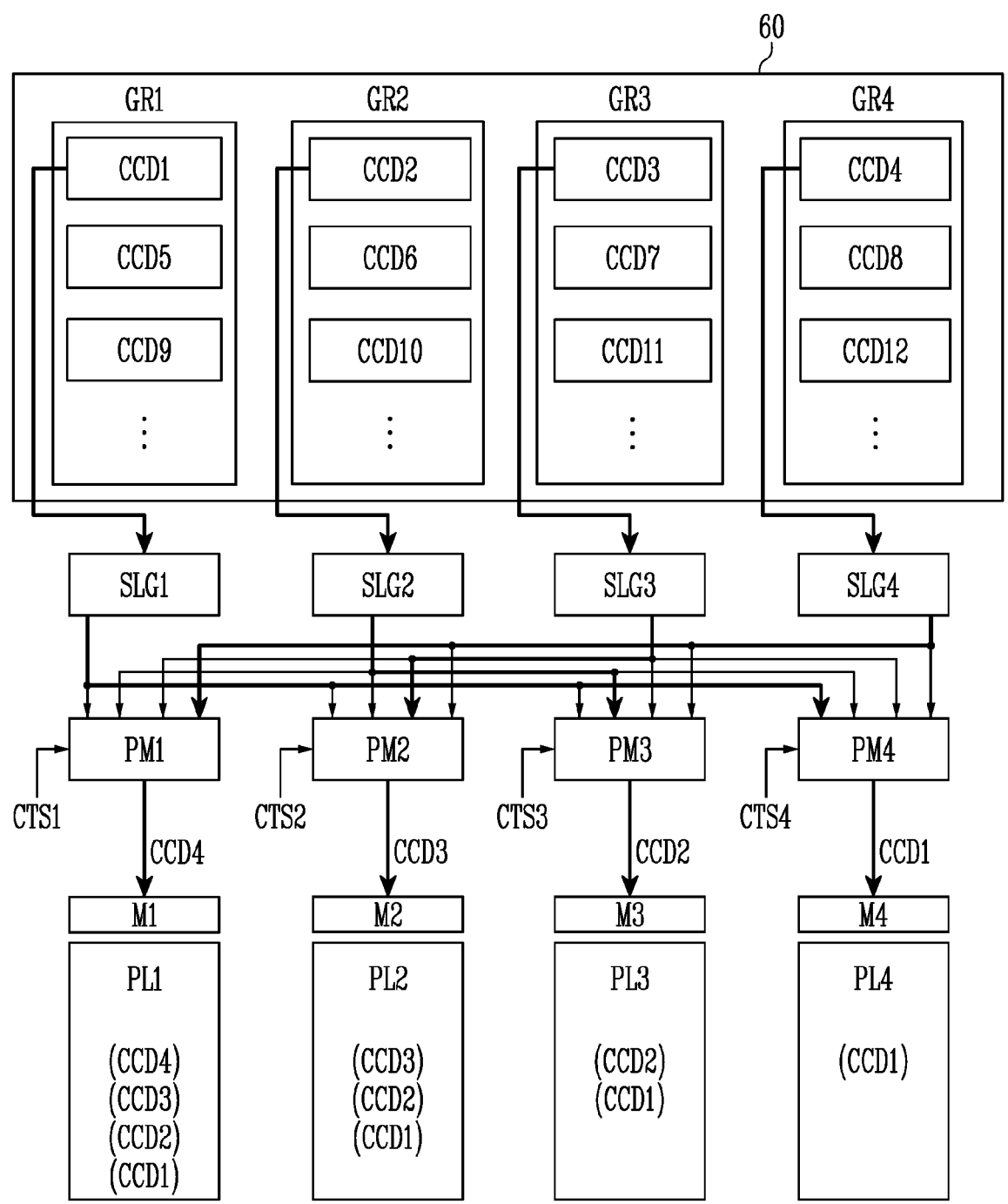

Referring to FIG. 9D, after the third, second, and first control codes CCD3, CCD2, and CCD1 are output from the first to third micro-control circuits M1 to M3, the fourth control code CCD4 of the fourth memory group GR4 may be transmitted to the fourth sub latch group SLG4. At this time, the first control code CCD1 received from the first memory group GR1 may be maintained in the first sub latch group SLG1, the second control code CCD2 received from the second memory group GR2 may be maintained in the second sub latch group SLG2, and the third control code CCD3 received from the third memory group GR3 may be maintained in the third sub latch group SLG3. The fourth control code CCD4 output from the fourth sub latch group SLG4 may be transmitted to the first to fourth plane MUXes PM1 to PM4, and the first plane MUX PM1 may output the fourth control code CCD4 in response to the first code transmission signal CTS1. The third control code CCD3 output from the third sub latch group SLG3 may be transmitted to the first to fourth plane MUXes PM1 to PM4, and the second plane MUX PM2 may output the third control code CCD3 in response to the second code transmission signal CTS2. The second control code CCD2 output from the second sub latch group SLG2 may be transmitted to the first to fourth plane MUXes PM1 to PM4, and the third plane MUX PM3 may output the second control code CCD2 in response to the third code transmission signal CTS3. The first control code CCD1 output from the first sub latch group SLG1 may be transmitted to the first to fourth plane MUXes PM1 to PM4, and the fourth plane MUX PM4 may output the first control code CCD1 in response to the fourth code transmission signal CTS4. The fourth control code CCD4 output from the first plane MUX PM1 may be transmitted to the first micro-control circuit M1, the third control code CCD3 output from the second plane MUX PM2 may be transmitted to the second micro-control circuit M2, the second control code CCD2 output from the third plane MUX PM3 may be transmitted to the third micro-control circuit M3, and the first control code CCD1 output from the fourth plane MUX PM4 may be transmitted to the fourth micro-control circuit M4. The first micro-control circuit M1 may sense the fourth control code CCD4 and control the peripheral circuits 1RD and 1PBG of FIG. 3 using the fourth control code CCD4 to perform the read operation of the first plane PL1. The second micro-control circuit M2 may sense the third control code CCD3 and control the peripheral circuits 2RD and 2PBG of FIG. 3 using the third control code CCD3 to perform the read operation of the second plane PL2. The third micro-control circuit M3 may sense the second control code CCD2 and control the peripheral circuits 3RD and 3PBG using the second control code CCD2 to perform the read operation of the third plane PL3. The fourth micro-control circuit M4 may sense the first control code CCD1 and control the peripheral circuits 4RD and 4PBG of FIG. 3 using the first control code CCD1 to perform the read operation of the fourth plane PL4.

Figure 9E:
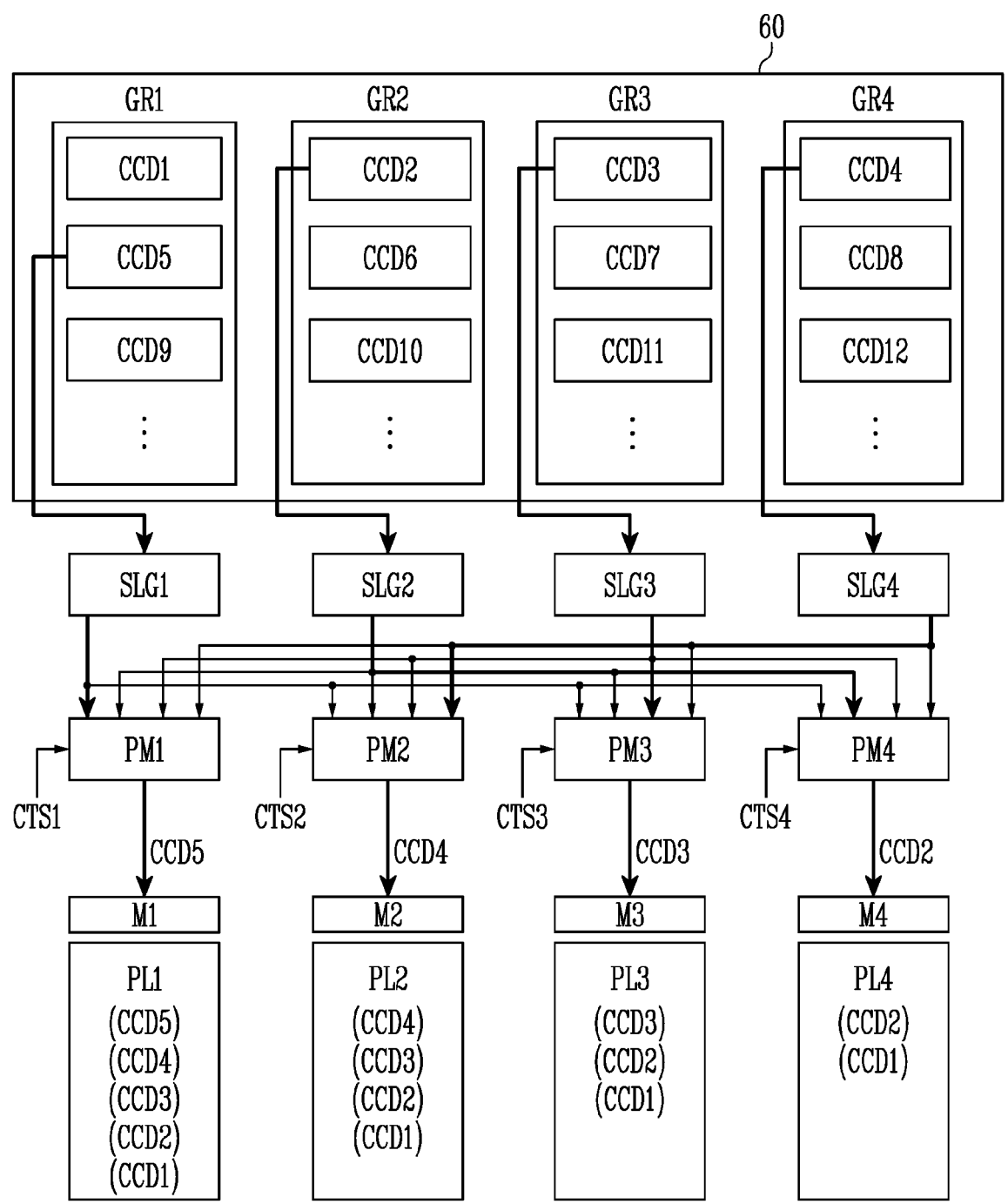

Referring to FIG. 9E, after the fourth, third, second, and first control codes CCD4, CCD3, CCD2, and CCD1 are output from the first to fourth micro-control circuits M1 to M4, the fifth control code CCD5 of the first memory group GR1 may be transmitted to the first sub latch group SLG1. That is, the first control code CCD1 may be removed from the first sub latch group SLG1 and the fifth control code CCD5 may be newly stored. At this time, the second control code CCD2 received from the second memory group GR2 may be maintained in the second sub latch group SLG2, the third control code CCD3 received from the third memory group GR3 may be maintained in the third sub latch group SLG3, and the fourth control code CCD4 received from the fourth memory group GR4 may be maintained in the fourth sub latch group SLG4. The fifth control code CCD5 output from the first sub latch group SLG1 may be transmitted to the first to fourth plane MUXes PM1 to PM4, and the first plane MUX PM1 may output the fifth control code CCD5 in response to the first code transmission signal CTS1. The second control code CCD2 output from the second sub latch group SLG2 may be transmitted to the first to fourth plane MUXes PM1 to PM4, and the fourth plane MUX PM4 may output the second control code CCD2 in response to the fourth code transmission signal CTS4. The third control code CCD3 output from the third sub latch group SLG3 may be transmitted to the first to fourth plane MUXes PM1 to PM4, and the third plane MUX PM3 may output the third control code CCD3 in response to the third code transmission signal CTS3. The fourth control code CCD4 output from the fourth sub latch group SLG4 may be transmitted to the first to fourth plane MUXes PM1 to PM4, and the second plane MUX PM2 may output the fourth control code CCD4 in response to the second code transmission signal CTS2.

The fifth control code CCD5 output from the first plane MUX PM1 may be transmitted to the first micro-control circuit M1, the fourth control code CCD4 output from the second plane MUX PM2 may be transmitted to the second micro-control circuit M2, the third control code CCD3 output from the third plane MUX PM3 may be transmitted to the third micro-control circuit M3, and the second control code CCD2 output from the fourth plane MUX PM4 may be transmitted to the fourth micro-control circuit M4. The first micro-control circuit M1 may sense the fifth control code CCD5 and control the peripheral circuits 1RD and 1PBG of FIG. 3 using the fifth control code CCD5 to perform the read operation of the first plane PL1. The second micro-control circuit M2 may sense the fourth control code CCD4 and control the peripheral circuits 2RD and 2PBG of FIG. 3 using the fourth control code CCD4 to perform the read operation of the second plane PL2. The third micro-control circuit M3 may sense the third control code CCD3 and control the peripheral circuits 3RD and 3PBG of FIG. 3 using the third control code CCD3 to perform the read operation of the third plane PL3. The fourth micro-control circuit M4 may sense the second control code CCD2 and control the peripheral circuits 4RD and 4PBG of FIG. 3 using the second control code CCD2 to perform the read operation of the fourth plane PL4.

A plane interleaving operation performed in the first to fourth planes PL1 to PL4 according to the control codes output from the first to fourth micro-control circuits M1 to M4 is described as follows.

Figures 10, 11:
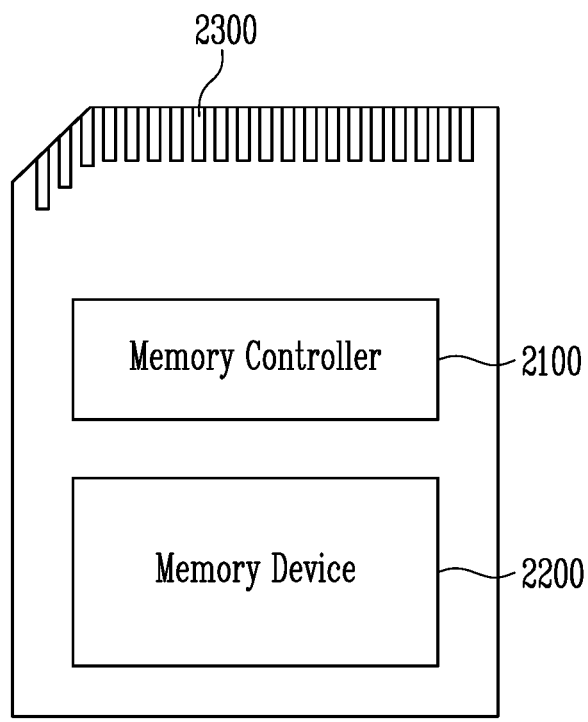
FIG. 10 is a diagram illustrating a plane interleaving operation according to an embodiment of the present disclosure.
FIG. 11 is a diagram illustrating a memory card system to which a memory device according to an embodiment of the present disclosure is applied.

FIG. 10 is a diagram illustrating a plane interleaving operation according to an embodiment of the present disclosure.

Referring to FIG. 10, at a first time t1, since the first control code CCD1 output from the first sub latch group SLG1 is transmitted to the first micro-control circuit M1, the first micro-control circuit M1 may control the read operation of the first plane PL1 in response to the first control code CCD1.

At a second time t2, the second control code CCD2 output from the second sub latch group SLG2 may be transmitted to the first micro-control circuit M1, and the first control code CCD1 output from the first sub latch group SLG1 may be transmitted to the second micro-control circuit M2. Therefore, the first micro-control circuit M1 may control the read operation of the first plane PL1 in response to the second control code CCD2, and the second micro-control circuit M2 may control the read operation of the second plane PL2 in response to the first control code CCD1.

At a third time t3, the third control code CCD3 output from the third sub latch group SLG3 may be transmitted to the first micro-control circuit M1, the second control code CCD2 output from the second sub latch group SLG2 may be transmitted to the second micro-control circuit M2, and the first control code CCD1 output from the first sub latch group SLG1 may be transmitted to the third micro-control circuit M3. Therefore, the first micro-control circuit M1 may control the read operation of the first plane PL1 in response to the third control code CCD3, the second micro-control circuit M2 may control the read operation of the second plane PL2 in response to the second control code CCD2, and the third micro-control circuit M3 may control the read operation of the third plane PL3 in response to the first control code CCD1.

At a fourth time t4, the fourth control code CCD4 output from the fourth sub latch group SLG4 may be transmitted to the first micro-control circuit M1, the third control code CCD3 output from the third sub latch group SLG3 may be transmitted to the second micro-control circuit M2, the second control code CCD2 output from the second sub latch group SLG2 may be transmitted to the third micro-control circuit M3, and the first control code CCD1 output from the first sub latch group SLG1 may be transmitted to the fourth micro-control circuit M4. Therefore, the first micro-control circuit M1 may control the read operation of the first plane PL1 in response to the fourth control code CCD4, the second micro-control circuit M2 may control the read operation of the second plane PL2 in response to the third control code CCD3, the third micro-control circuit M3 may control the read operation of the third plane PL3 in response to the second control code CCD2, and the fourth micro-control circuit M4 may control the read operation of the fourth plane PL4 in response to the first control code CCD1.

At a fifth time t5, the fifth control code CCD5 may be newly stored in the first sub latch group SLG1, and the fifth control code CCD5 may be transmitted to the first micro-control circuit M1. The fourth control code CCD4 output from the fourth sub latch group SLG4 may be transmitted to the second micro-control circuit M2, the third control code CCD3 output from the third sub latch group SLG3 may be transmitted to the third micro-control circuit M3, and the second control code CCD2 output from the second sub latch group SLG2 may be transmitted to the fourth micro-control circuit M4. Therefore, the first micro-control circuit M1 may control the read operation of the first plane PL1 in response to the fifth control code CCD5, the second micro-control circuit M2 may control the read operation of the second plane PL2 in response to the fourth control code CCD4, the third micro-control circuit M3 may control the read operation of the third plane PL3 in response to the third control code CCD3, and the fourth micro-control circuit M4 may control the read operation of the fourth plane PL4 in response to the second control code CCD2.

At a sixth time t6, the sixth control code CCD6 may be newly stored in the second sub latch group SLG2, and the sixth control code CCD6 may be transmitted to the first micro-control circuit M1. The fifth control code CCD5 output from the first sub latch group SLG1 may be transmitted to the second micro-control circuit M2, the fourth control code CCD4 output from the fourth sub latch group SLG4 may be transmitted to the third micro-control circuit M3, and the third control code CCD3 output from the third sub latch group SLG3 may be transmitted to the fourth micro-control circuit M4. Therefore, the first micro-control circuit M1 may control the read operation of the first plane PL1 in response to the sixth control code CCD6, the second micro-control circuit M2 may control the read operation of the second plane PL2 in response to the fifth control code CCD5, the third micro-control circuit M3 may control the read operation of the third plane PL3 in response to the fourth control code CCD4, and the fourth micro-control circuit M4 may control the read operation of the fourth plane PL4 in response to the third control code CCD3.

In the above-described method, the control codes may be sequentially stored in the first to fourth sub latch groups SLG1 to SLG4, and the control codes stored in the first to fourth sub latch groups SLG1 to SLG4 may be transmitted to the micro-control circuits M1 to M4 selected by the plane MUXes, respectively. The micro-control circuits M1 to M4 may sense the transmitted control codes and control the peripheral circuits connected to the first to fourth planes PL1 to PL4, respectively, in response to the sensed control codes.

FIG. 11 is a diagram illustrating a memory card system to which a memory device according to an embodiment of the present disclosure is applied.

Referring to FIG. 11, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control a program, read, or erase operation of the memory device 2200 or control a background operation. The memory controller 2100 is configured to provide an interface between the memory device 2200 and a host. The memory controller 2100 is configured to drive firmware for controlling the memory device 2200. The memory device 2200 may be configured identically to the memory device MD described with reference to FIG. 2.

The memory controller 2100 may communicate with an external device through the connector 2300. The memory controller 2100 may communicate with the external device (for example, the host) according to a specific communication standard. For example, the memory controller 2100 is configured to communicate with the external device through at least one of various communication standards such as a universal serial bus (USB), a multimedia card (MMC), an embedded MMC (eMMC), peripheral component interconnection (PCI), PCI-express (PCI-E), advanced technology attachment (ATA), serial-ATA, parallel-ATA, a small computer system interface (SCSI), an enhanced small disk interface (ESDI), integrated drive electronics (IDE), firewire, a universal flash storage (UFS), WIFI, Bluetooth, and NVMe. For example, the connector 2300 may be defined by at least one of the various communication standards described above.

For example, the memory device 2200 may be configured of various nonvolatile memory devices such as an electrically erasable and programmable ROM (EEPROM), a NAND flash memory, a NOR flash memory, a phase-change RAM (PRAM), a resistive RAM (ReRAM), ferroelectric RAM (FRAM), and a spin transfer torque-magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 12:
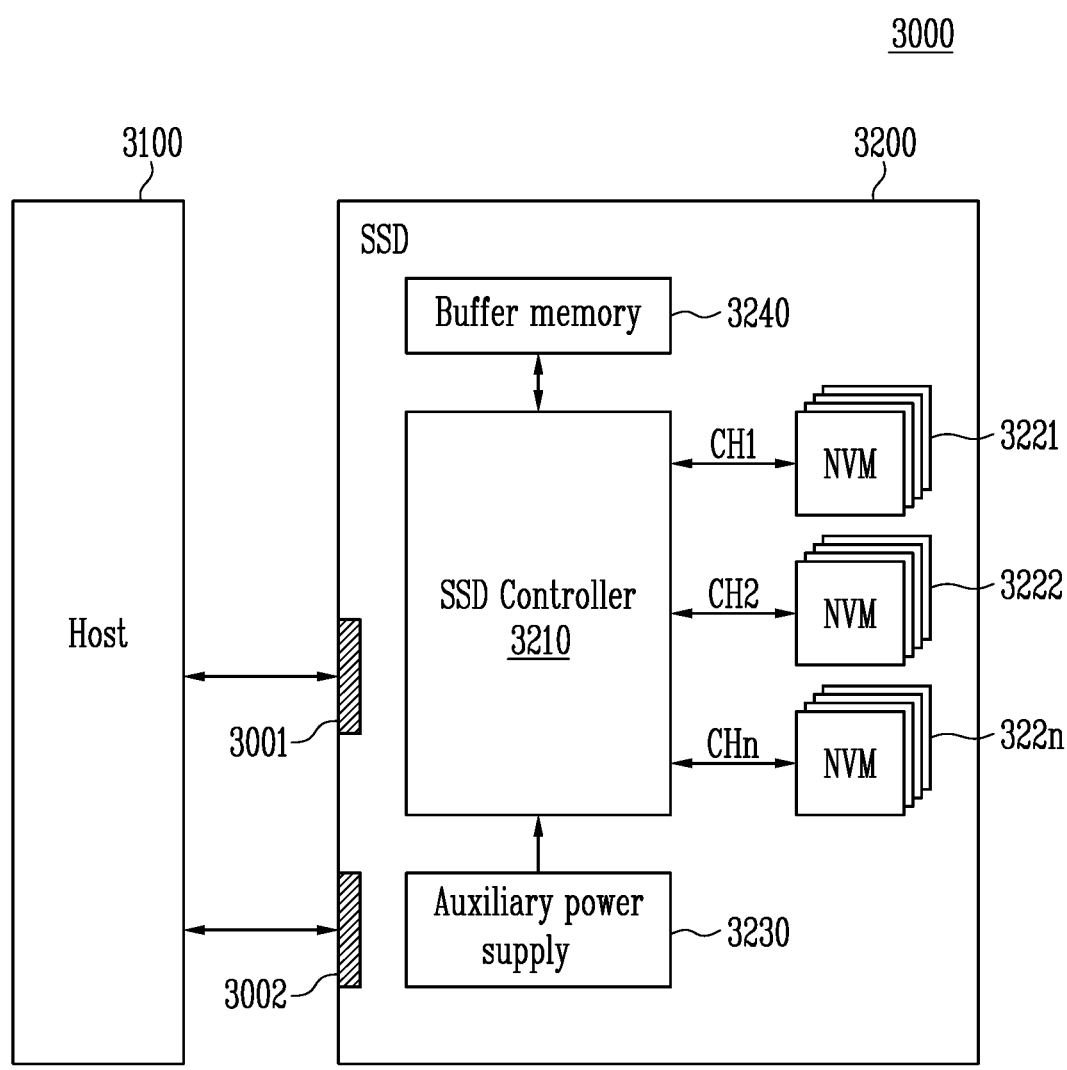
FIG. 12 is a diagram illustrating a solid state drive (SSD) system to which a memory device according to an embodiment of the present disclosure is applied.

FIG. 12 is a diagram illustrating a solid state drive (SSD) system to which a memory device according to an embodiment of the present disclosure is applied.

Referring to FIG. 12, the SSD system 3000 includes a host 3100 and an SSD 3200. The SSD 3200 exchanges a signal with the host 3100 through a signal connector 3001 and receives power through a power connector 3002. The SSD 3200 includes an SSD controller 3210, a plurality of flash memories 3221 to 322n, an auxiliary power supply 3230, and a buffer memory 3240.

According to an embodiment of the present disclosure, the flash memories 3221 to 322n may be configured identically to the memory device MD described with reference to FIG. 2.

The SSD controller 3210 may control the plurality of flash memories 3221 to 322n in response to the signal received from the host 3100. For example, the signal may be signals based on an interface between the host 3100 and the SSD 3200. For example, the signal may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power supply 3230 is connected to the host 3100 through the power connector 3002. The auxiliary power supply 3230 may receive the power from the host 3100 and may charge the power. The auxiliary power supply 3230 may provide power of the SSD 3200 when power supply from the host 3100 is not smooth. For example, the auxiliary power supply 3230 may be positioned in the SSD 3200 or may be positioned outside the SSD 3200. For example, the auxiliary power supply 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, and an LPDDR SDRAM, or nonvolatile memories such as an FRAM, a ReRAM, an STT-MRAM, and a PRAM.

While the present disclosure has been illustrated and described with respect to specific embodiments, the disclosed embodiments are provided for the description, and not intended to be restrictive. Further, it is noted that the present disclosure may be achieved in various ways through substitution, change, and modification that fall within the scope of the following claims, as those skilled in the art will recognize in light of the present disclosure.

What is claimed is:

1. A memory device comprising:
   a plurality of planes in which data is stored;
   a peripheral circuit configured to perform operations on the plurality of planes;
   micro-control circuits configured to control the peripheral circuit so that the operations on the plurality of planes are independently performed; and
   a memory manager including a control memory in which different control codes for controlling the peripheral circuit are stored, and configured to output the control codes to the micro-control circuits,
   wherein the memory manager is configured to sequentially output a selected control code among the control codes to the micro-control circuits respectively corresponding to the planes.

2. The memory device of claim 1, wherein each of the planes includes a plurality of memory blocks each including a plurality of memory cells in which the data is stored.

3. The memory device of claim 1, wherein the peripheral circuit includes row decoders and page buffer groups controlled by the micro-control circuits, respectively.

4. The memory device of claim 3, wherein one among the row decoders and one among the page buffer groups form a pair to control a corresponding plane among the planes.

5. The memory device of claim 4, wherein each of the micro-control circuits is configured to independently control a corresponding pair among the pairs of the row decoders and the page buffer groups in response to the control codes.

6. The memory device of claim 1, wherein the memory manager comprises:
   the control memory including a plurality of memory groups respectively corresponding to the plurality of planes;
   sub latch groups respectively corresponding to the memory groups and configured to respectively store the control codes stored in the memory groups;
   plane MUXes configured to sequentially output the control codes received from the sub latch groups according to an order of the operations performed on each of the plurality of planes;
   an address MUX configured to output read voltages of the memory groups according to a plane address; and
   a scheduler configured to control the sub latch groups, the plane MUXes, and the address MUX in response to a command.

7. The memory device of claim 6, wherein the memory manager is configured to output the control codes for controlling the planes using the control memory as a single memory for storing the control codes.

8. The memory device of claim 6, wherein the sub latch groups are configured to temporarily store the control codes read from each of the memory groups and transmit the control codes to the plane MUXes.

9. The memory device of claim 6, wherein the plane MUXes are configured to commonly receive the control codes from the sub latch groups and output the selected control code to a selected micro-control circuit according to control of the scheduler.

10. The memory device of claim 6, wherein when the control code stored in a last sub latch group among the sub latch groups is output, the scheduler controls the sub latch groups so that a previous control code stored in a first sub latch group among the sub latch groups is removed and a next control code stored in a memory group corresponding to the first sub latch group among the memory groups is stored in the first sub latch group.

11. A memory device comprising:
a control memory including first to N-th memory groups in which different control codes are stored;
first to N-th sub latch groups respectively connected to the first to N-th memory groups and configured to sequentially store the control codes stored in the first to N-th memory groups, respectively; and
first to N-th plane MUXes configured to commonly receive the control codes from the first to N-th sub latch groups and output the received control codes to a selected micro-control circuit among first to N-th micro-control circuits.

12. The memory device of claim 11, wherein the control memory includes memory cells configured of a read only memory (ROM), a programmable ROM (PROM), an electrically programmable ROM (EPROM), or an electrically erasable and programmable ROM (EEPROM).

13. The memory device of claim 11, further comprising a scheduler configured to control the first to N-th sub latch groups and the first to N-th plane MUXes in response to a command.

14. The memory device of claim 13, wherein the scheduler is configured to control:
the first memory group to transmit a first control code stored therein to the first sub latch group,
a second memory group among the first to N-th memory groups to transmit a second control code stored therein to a second sub latch group among the first to N-th sub latch groups,
the first sub latch group to commonly transmit the first control code stored therein to the first to N-th plane MUXes, and
the second sub latch group to commonly transmit the second control code stored therein to the first to N-th plane MUXes.

15. The memory device of claim 14, wherein the scheduler controls the first to N-th plane MUXes so that the first control code transmitted to the first plane MUX is output to the first micro-control circuit.

16. The memory device of claim 15, wherein when the first plane MUX outputs the first control code, the scheduler stops an output of the remaining second to N-th plane MUXes.

17. The memory device of claim 15, wherein after the first control code is output to the first micro-control circuit, the scheduler controls the first to N-th plane MUXes so that the second control code transmitted to the first plane MUX is output to the first micro-control circuit and the first control code transmitted to a second plane MUX among the first to N-th plane MUXes is output to a second micro-control circuit among the first to N-th micro control circuits.

18. The memory device of claim 17, wherein when the first plane MUX outputs the second control code and the second plane MUX outputs the first control code, the scheduler stops an output of the remaining third to N-th plane MUXes.

19. The memory device of claim 11, wherein the control codes are set for the first to N-th micro-control circuits to control different read operations on a plurality of planes in which data is stored.

20. A memory device comprising:
N number of control circuits configured to control N number of storage circuits to perform a plane interleaving operation by providing, at each interval, the storage circuits with control codes, respectively;
a memory cell array configured to output, at the interval, one among different control codes stored therein; and
a managing circuit configured to provide, at the interval, one among the control circuits with the control code output from the memory cell array, thereby sequentially providing, over the intervals, the control circuits with each of the control codes sequentially output from the memory cell array.

* * * * *